(12) United States Patent
Wu et al.

(10) Patent No.: US 7,655,561 B2
(45) Date of Patent: *Feb. 2, 2010

(54) METHOD FOR MAKING AN OPENING FOR ELECTRICAL CONTACT BY ETCH BACK PROFILE CONTROL

(75) Inventors: Han Ming Wu, Shanghai (CN); Eric Kuang, Shanghai (CN); Wei Ji Song, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 117 days.

This patent is subject to a terminal disclaimer.

(21) Appl. No.: 11/497,552

(22) Filed: Jul. 31, 2006

(65) Prior Publication Data

US 2007/0087561 A1 Apr. 19, 2007

Related U.S. Application Data

(63) Continuation of application No. 10/773,565, filed on Feb. 6, 2004, now Pat. No. 7,084,054.

(30) Foreign Application Priority Data

Dec. 30, 2003 (CN) .......................... 2003 1 0122966

(51) Int. Cl.
*H01L 21/4763* (2006.01)
(52) U.S. Cl. ....................... 438/638; 438/706; 438/710; 257/E21.218
(58) Field of Classification Search ................ 438/622, 438/638, 706, 710; 257/E21.218
See application file for complete search history.

(56) References Cited

U.S. PATENT DOCUMENTS

| 7,084,054 B2* | 8/2006 | Wu et al. ................ 438/622 |
| 2004/0077175 A1* | 4/2004 | Hsieh et al. ............. 438/694 |
| 2004/0106297 A1* | 6/2004 | Kanegae et al. .......... 438/725 |

\* cited by examiner

*Primary Examiner*—Thanh Nguyen
(74) *Attorney, Agent, or Firm*—Townsend and Townsend and Crew LLP

(57) ABSTRACT

A method and apparatus for etchback profile control. The method includes performing a first etch through a first dielectric layer to form a first via and a second dielectric layer, filling the first via with a BARC material to form a first BARC layer, and performing a second etch on the first BARC layer to form a second BARC layer. The second etch has a first etch rate in a first peripheral region of the second BARC layer and a second etch rate in a first central region of the second BARC layer. The first peripheral region is located around a sidewall of the first via, and the first central region is located around a center of the first via. The first etch rate is larger than the second etch rate, and the first peripheral region is located higher than the first central region. A first top surface of the second BARC layer has substantially a first convex shape. Additionally, the method includes performing a third etch through a second dielectric layer to form a trench and a third BARC layer. The trench has a trench bottom surface, which is substantially free from any spike around a side surface of the third BARC layer. A second top surface of the third BARC layer has substantially a second convex shape. Moreover, the method includes removing the third BARC layer to form a second via.

3 Claims, 18 Drawing Sheets

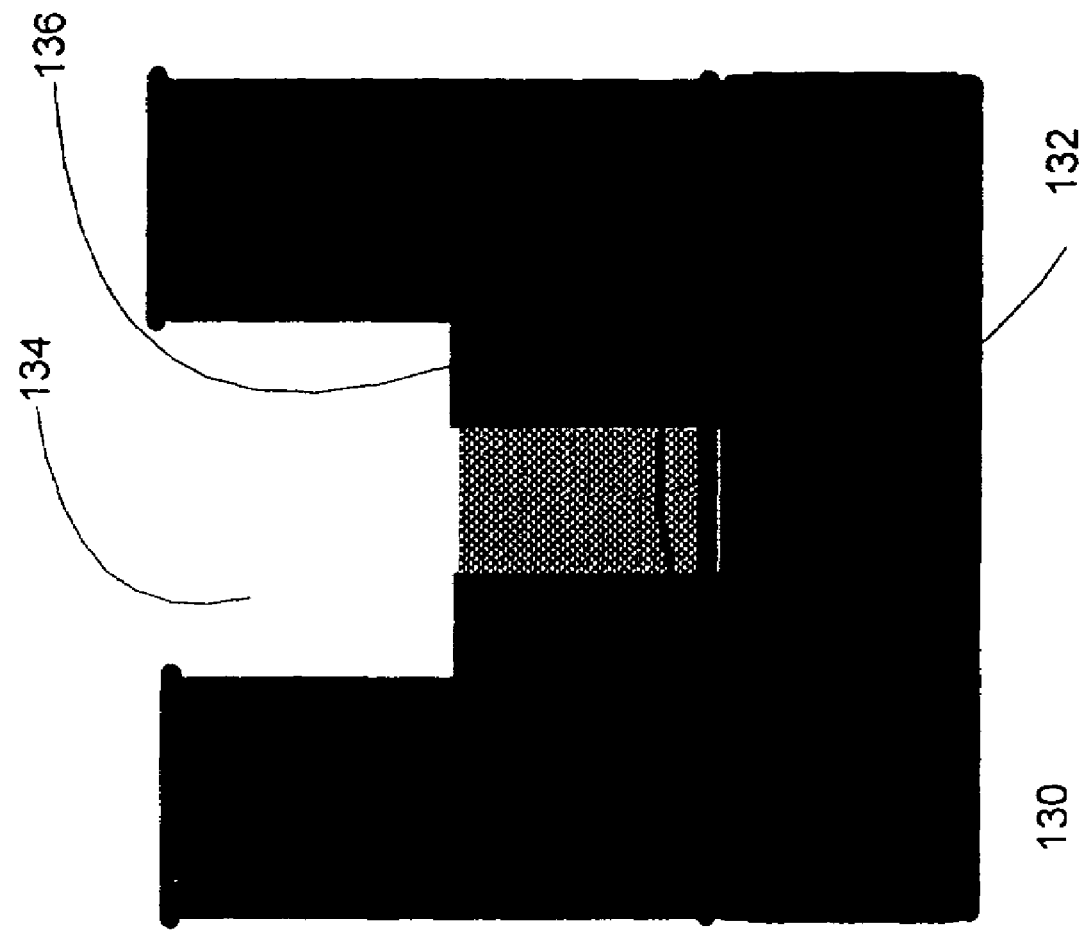

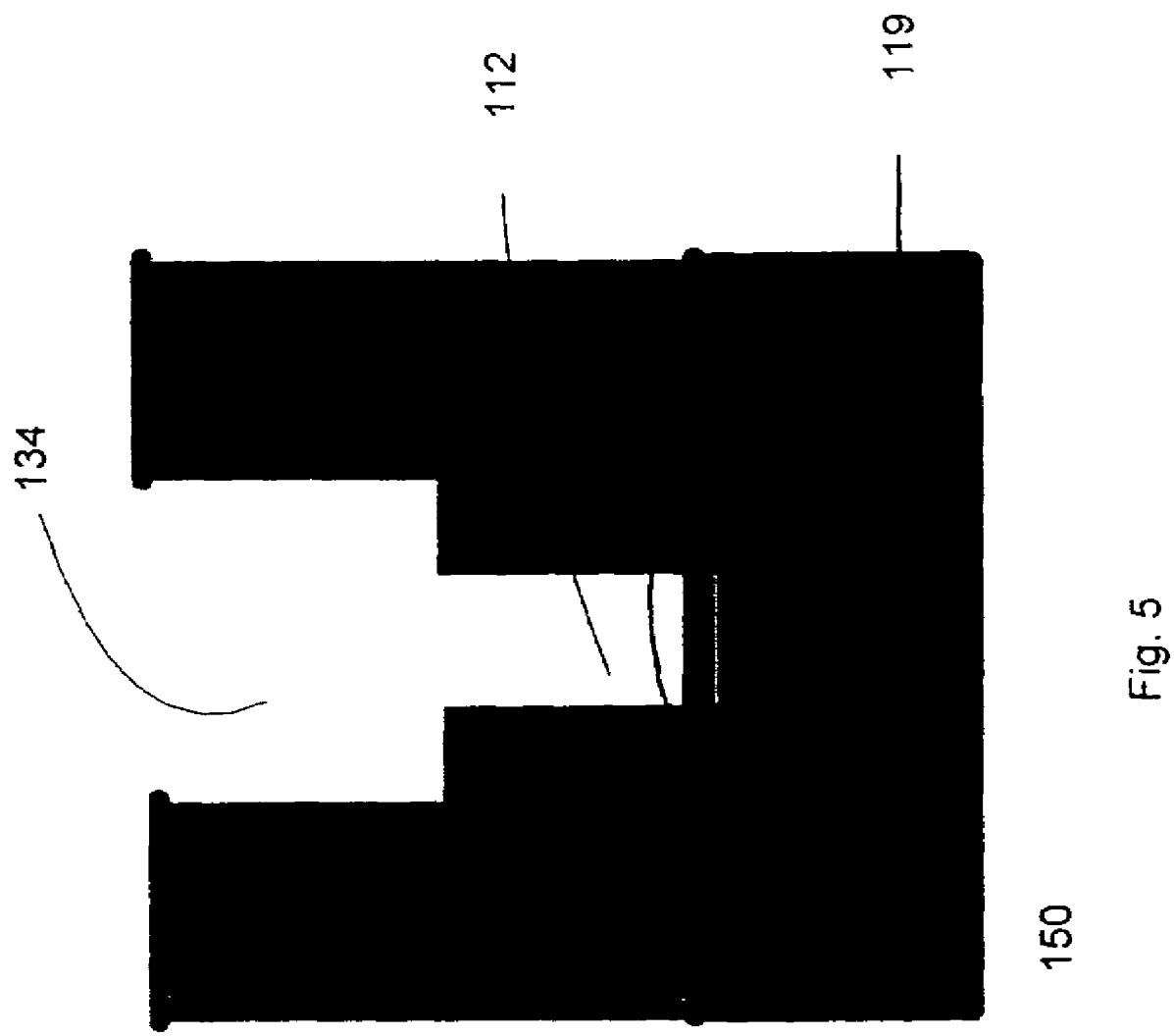

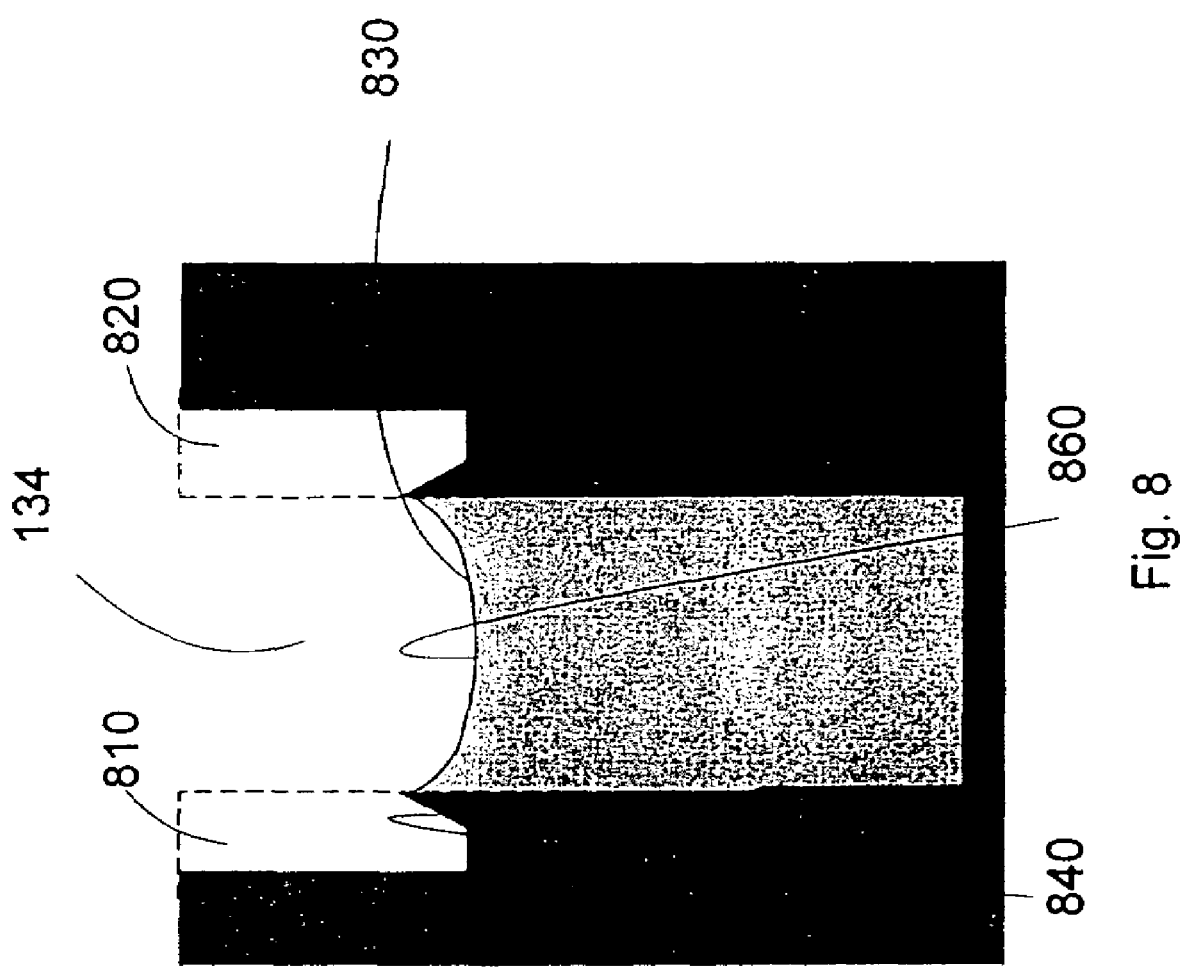

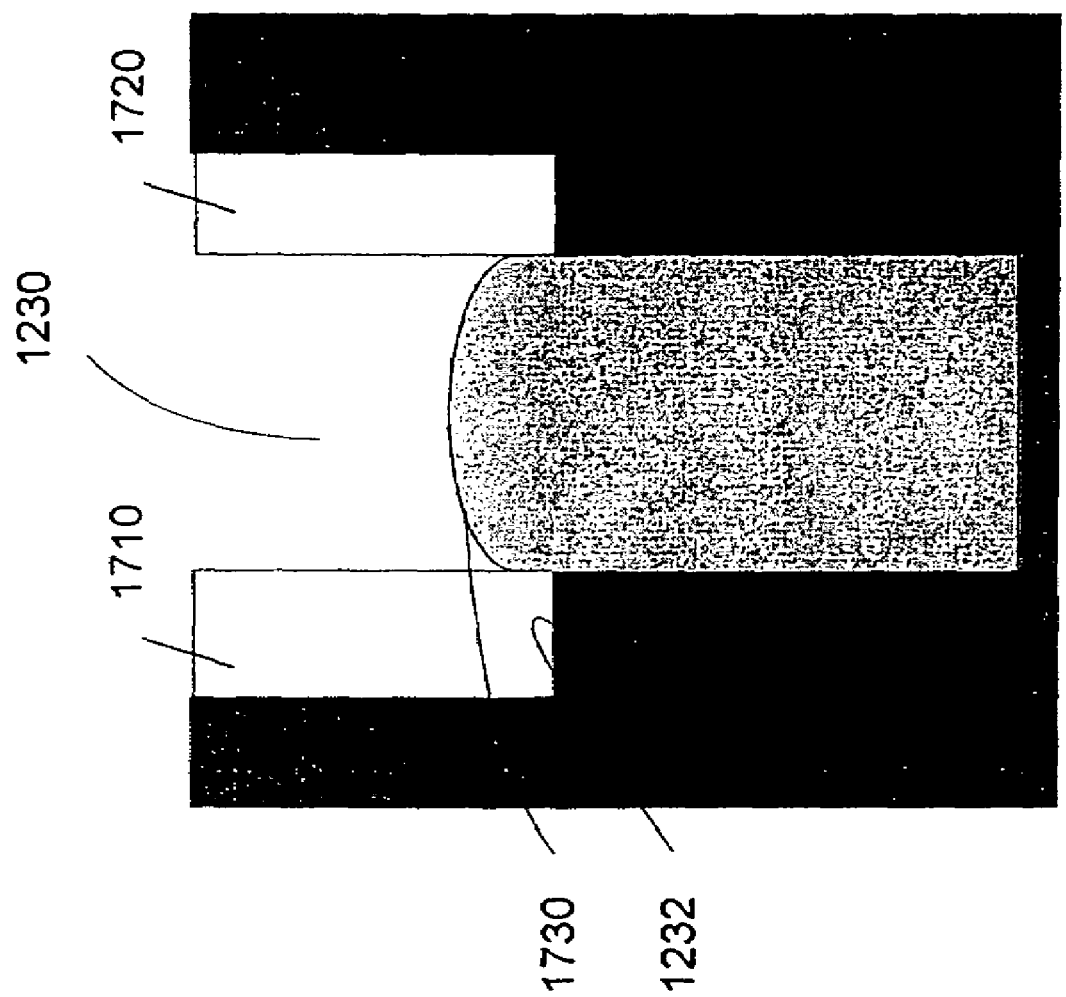

METHOD FOR MAKING AN OPENING FOR ELECTRICAL CONTACT BY ETCH BACK PROFILE CONTROL

CROSS-REFERENCES TO RELATED APPLICATIONS

This application is a continuation of U.S. patent application Ser. No. 10/773,565 filed Feb. 6, 2004, now U.S. Pat. No. 7,084,054 which claims priority to Chinese Patent Application No. 200310122966.4 filed Dec. 30, 2003, commonly assigned, and hereby incorporated by references for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. More particularly, the invention provides a method and apparatus for controlling etchback profile. Merely by way of example, the invention has been applied to making electrical connections between two metal levels. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is to make reliable electrical connections between two metal layers with low resistance.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, electrical contacts between two metal layers usually have limited reliability and conductivity. These and other limitations are described throughout the present specification and more particularly below.

FIGS. 1 through 6 are simplified diagrams for a conventional method of making an electrical contact between two metal layers. These diagrams are merely examples, which should not unduly limit the scope of the claims herein. The method includes process 110 for via etching, process 120 for BARC etchback, process 130 for trench etching, process 140 for ashing, process 150 for stop layer removal, and process 160 for trench and via filling. At process 110 for via etching, via 112 is fabricated through silicon oxynitride layer 114 and FSG layer 116. FSG is usually composed of silicon oxide and fluorine. Silicon oxynitride layer 114 is located on FSG layer 116. Via 112 has via bottom 113 formed by a portion of silicon nitride layer 118. Another portion of silicon nitride layer 118 lies under FSG layer 116. Silicon nitride layer 118 is deposited on the surface of metal layer 119. At process 120 for BARC etchback, a BARC layer fills via 112 and is then etched back to form BARC layer 122. BARC stands for bottom anti-reflection coating. The BARC material is a conventional type of photoresist. At process 130 for trench etching, BARC layer 122 is further etched back to form BARC layer 132. Additionally, a portion of silicon oxynitride layer 114 and a portion of FSG layer 116 are removed to form trench 134. Trench 134 has trench bottom 136, a portion of which is composed of BARC and another portion of which is composed of FSG. At process 140 for ashing, BARC layer 132 is removed from via 112. At process 150 for stop layer removal, the part of silicon nitride layer 118 that forms via bottom 113 is removed. Consequently, metal layer 119 is exposed within via 112 and trench 134. At process 160 for trench and via filling, via 112 and trench 134 are filled with conductive material, such as copper, to form conductive filling layer 162. Conductive filling layer 162 forms an electrical contact between metal layer 119 and metal layer 164. Part of metal layer 164 lies on the surface of silicon oxynitride layer 114. The electrical contact usually has limited conductivity and reliability.

Hence, it is desirable to improve technique for making an electrical contact.

BRIEF SUMMARY OF THE INVENTION

The present invention is directed to integrated circuits and their processing for the manufacture of semiconductor devices. More particularly, the invention provides a method and apparatus for controlling etchback profile. Merely by way of example, the invention has been applied to making electrical connections between two metal levels. But it would be recognized that the invention has a much broader range of applicability.

In a specific embodiment, the invention provides a method for making an opening for electrical contact. The method includes performing a first etch through a first dielectric layer to form a first via and a second dielectric layer and filling the first via with a BARC material to form a first BARC layer. Additionally, the method includes performing a second etch on the first BARC layer to form a second BARC layer. The second etch has a first etch rate in a first peripheral region of the second BARC layer and a second etch rate in a first central region of the second BARC layer. The first peripheral region is located around a sidewall of the first via, and the first central region is located around a center of the first via. The first etch rate is larger than the second etch rate, and the first peripheral region is located higher than the first central region. A first top surface of the second BARC layer has substantially a first convex shape. Moreover, the method includes performing a third etch through a second dielectric layer to form a trench and a third BARC layer. The trench has a trench bottom surface, and the trench bottom surface is substantially free from any spike around a side surface of the third BARC layer. A second top surface of the third BARC layer has substantially a second convex shape. Additionally, the method includes removing the third BARC layer to form a second via.

In another embodiment, a method for making an electrical contact includes performing a first etch through a first protective layer and a first dielectric layer to form a first via, a second protective layer and a second dielectric layer. The first protective layer is located on the first dielectric layer. Additionally, the method includes filling the first via with a BARC material to form a first BARC layer and performing a second etch on the first BARC layer to form a second BARC layer. The second etch has a first etch rate in a first peripheral region of the second BARC layer and a second etch rate in a first central region of the second BARC layer. The first peripheral region is located around a sidewall of the first via, and the first central region is located around a center of the first via. The first etch rate is larger than the second etch rate, and the first peripheral region is located higher than the first central region. Moreover, the method includes performing a third etch through a second protective layer and a second dielectric layer to form a trench and a third BARC layer. The trench has a trench bottom surface, which is substantially free from any spike around a side surface of the third BARC layer. Additionally, the method includes removing the third BARC layer to form a second via. A cross-section of the second via is smaller than a cross-section of the trench. Moreover, the method includes performing a fourth etch through a stop layer to form a third via and filling the trench and the third via with a conductive material. The dielectric layer is located on the stop layer.

Many benefits are achieved by way of the present invention over conventional techniques. In some embodiments, the method lowers resistance of electrical contact and improves device reliability. Additionally, the method provides a process that is compatible with conventional process technology without substantial modifications to conventional equipment and processes. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and apparatus for controlling etchback profile. Merely by way of example, the invention has been applied to making electrical connections between two metal levels. But it would be recognized that the invention has a much broader range of applicability.

Figure 1:
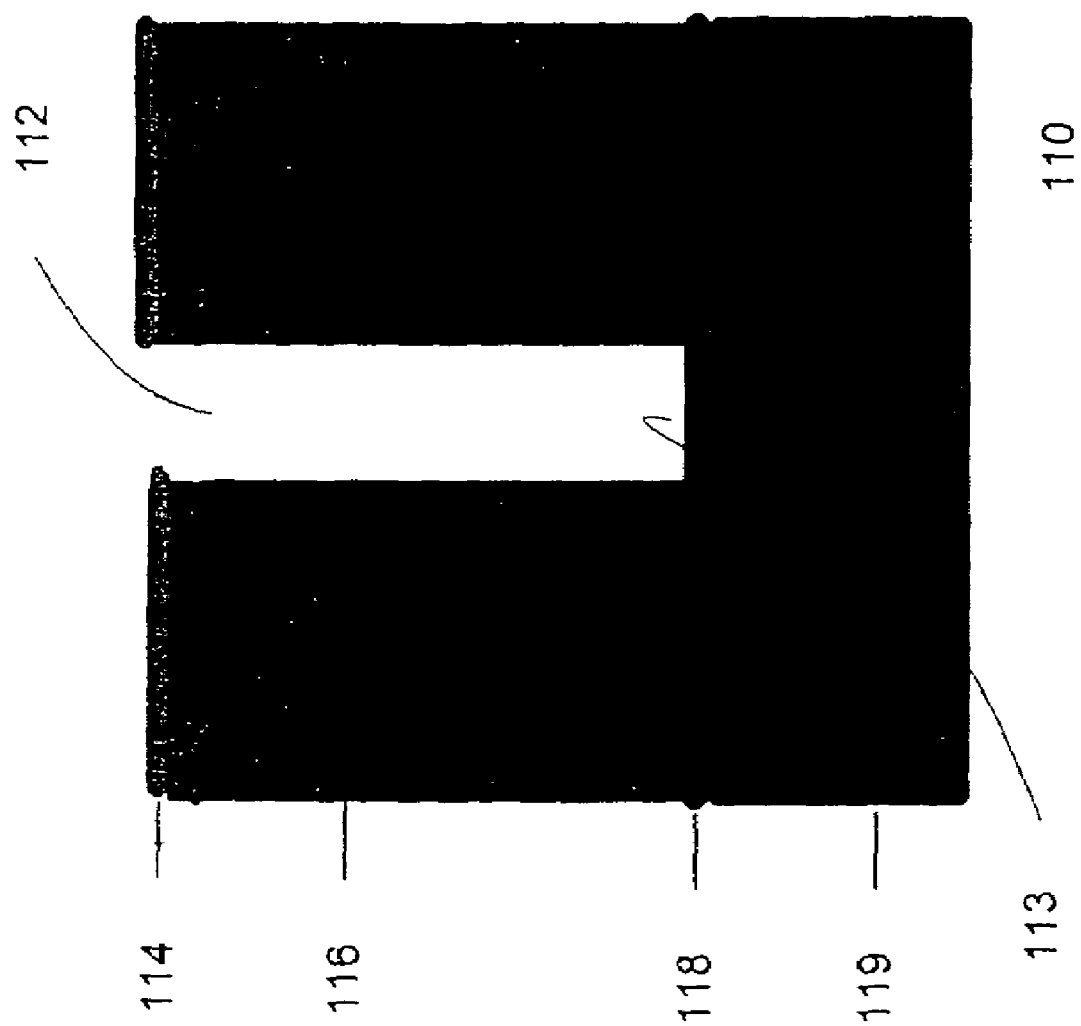
FIGS. 1 through 6 are simplified diagrams for a conventional method of making an electrical contact between two metal layers.
Figure 2:
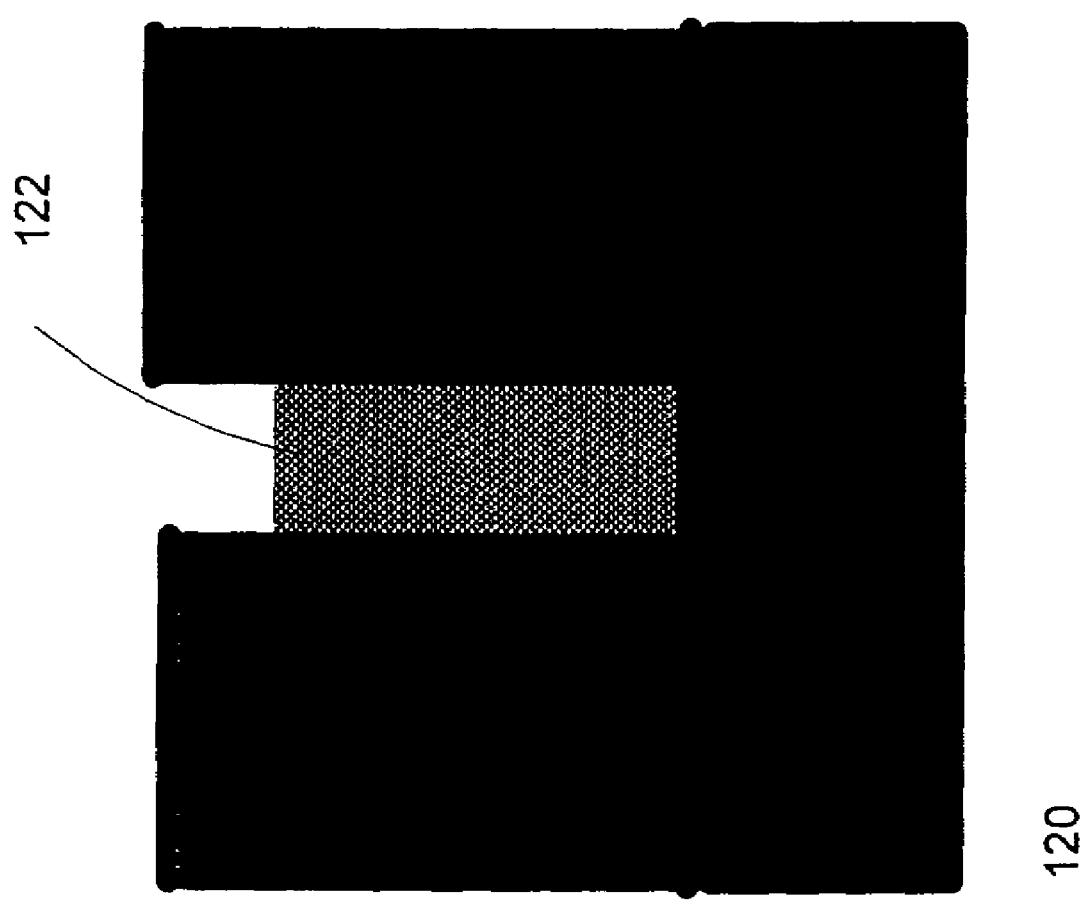
Figure 4:
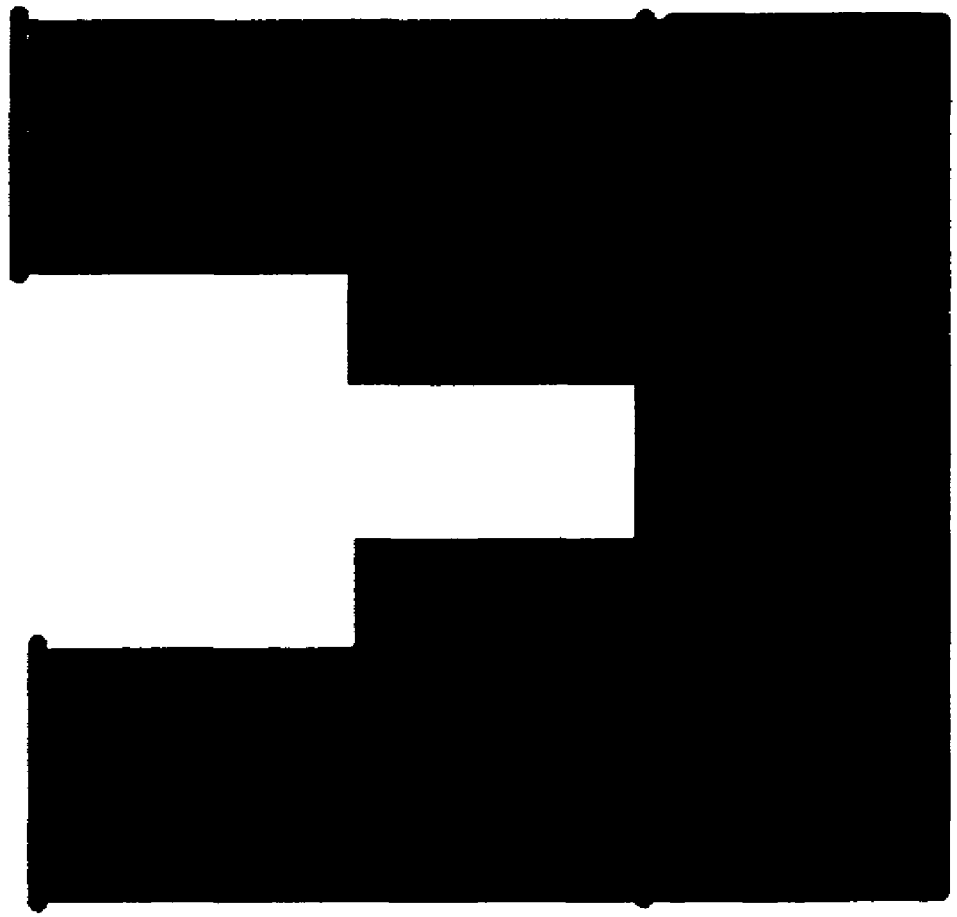
Figure 6:
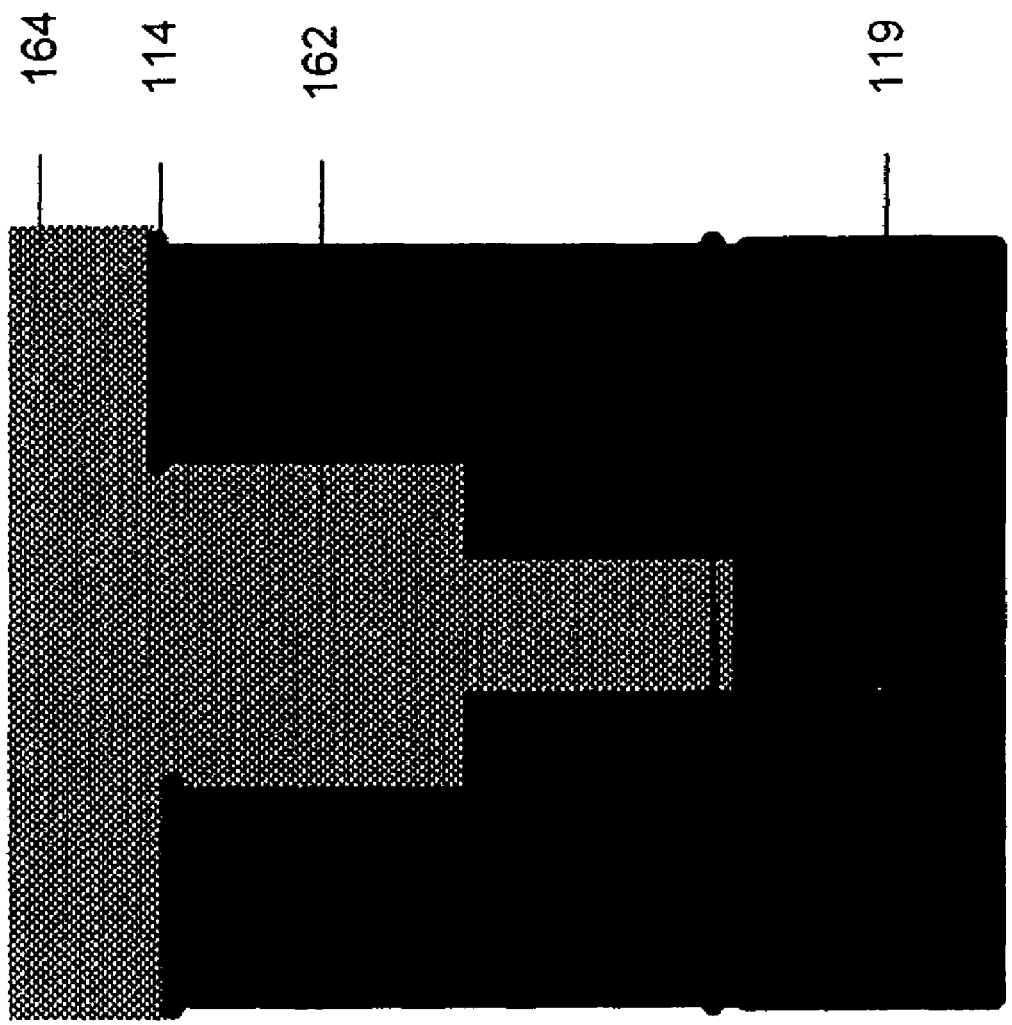
Figure 7:
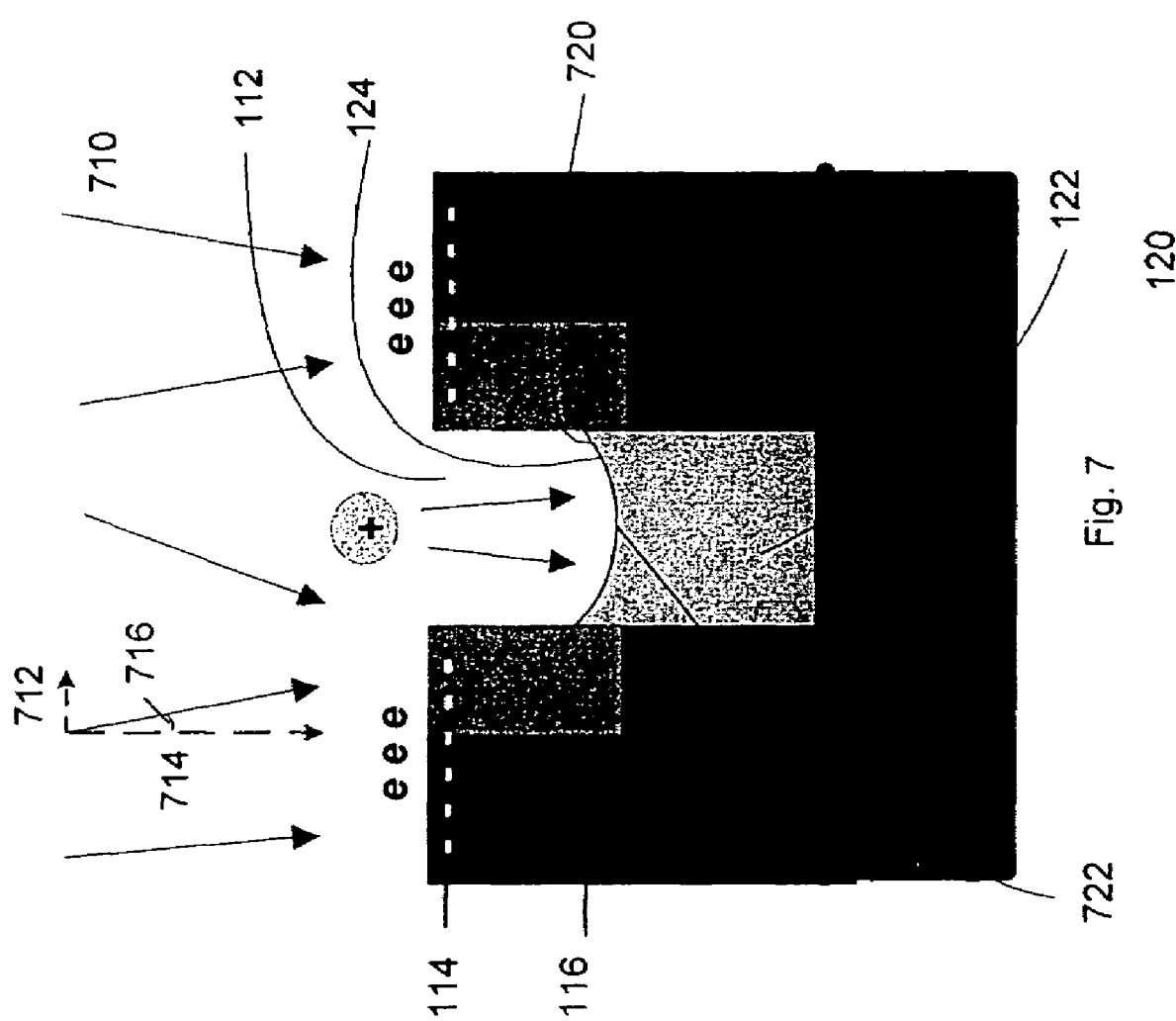
FIG. 7 is a simplified diagram for concave profile of BARC layer resulting from the method as shown in FIGS. 1-6.

FIG. 7 is a simplified diagram for concave profile of BARC layer resulting from the method as shown in FIGS. 1-6. This diagram is merely an example, which should not unduly limit the scope of the claims herein. One of ordinary skill in the art would recognize many variations, alternatives, and modifications. Under the conventional method for forming electrical contact, at process 120 for BARC etchback, BARC etchback layer 122 usually has concave top surface 124. Concave top surface 124 has peripheral region 720 around side surfaces of silicon oxynitride layer 114 and FSG layer 116 and central region 722 around the center of via 112. Peripheral region 720 is usually located higher than central region 722. Concave top surface may have resulted from one or several etching mechanisms. For example, process 120 usually uses a dry etch process. The ion flux 710 usually contains ions with horizontal velocity component 712 and vertical velocity component 714. The ratio of horizontal velocity component 712 and vertical velocity component 714 determines angle 712. The average magnitude of angle 712 for all ions of ion flux 710 usually exceeds 20 degrees. The ions with relatively large angel 712 cannot reach peripheral region 720; therefore the etch rate at peripheral region 720 is smaller than at central region 722. Additionally, if the plasma used for process 120 has a small plasma density, the electron density on the surface of silicon oxynitride layer 114 is also small. Consequently the low negative charge density around side surfaces of silicon oxynitride layer 114 and FSG layer 116 usually cannot effectively attract positive ions to peripheral region or thereby increase the etch rate in this region.

Figure 8:
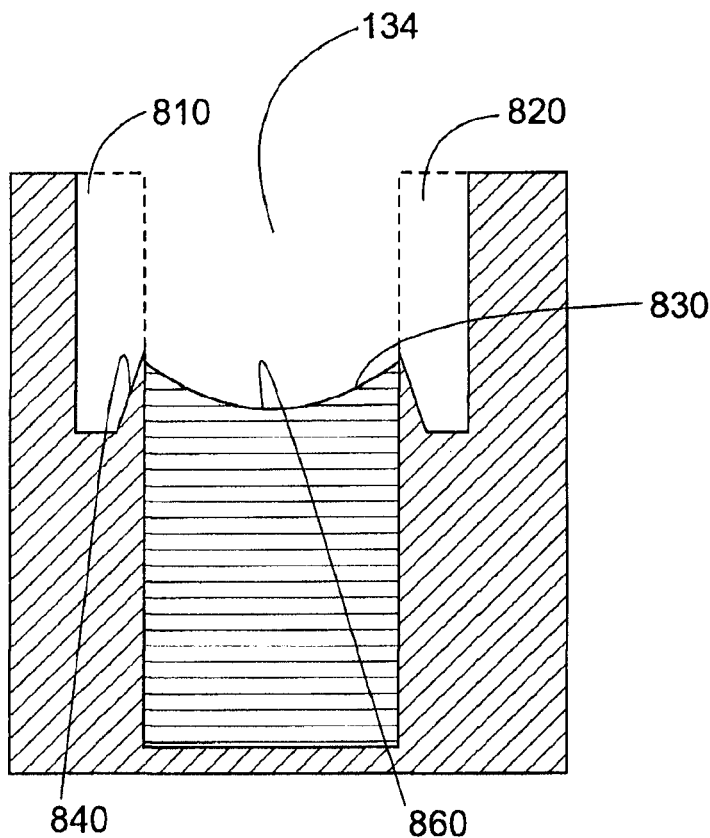
FIG. 8 is a simplified diagram for fencing effect during trench etching resulting from the method as shown in FIGS. 1-6.
Figure 9:
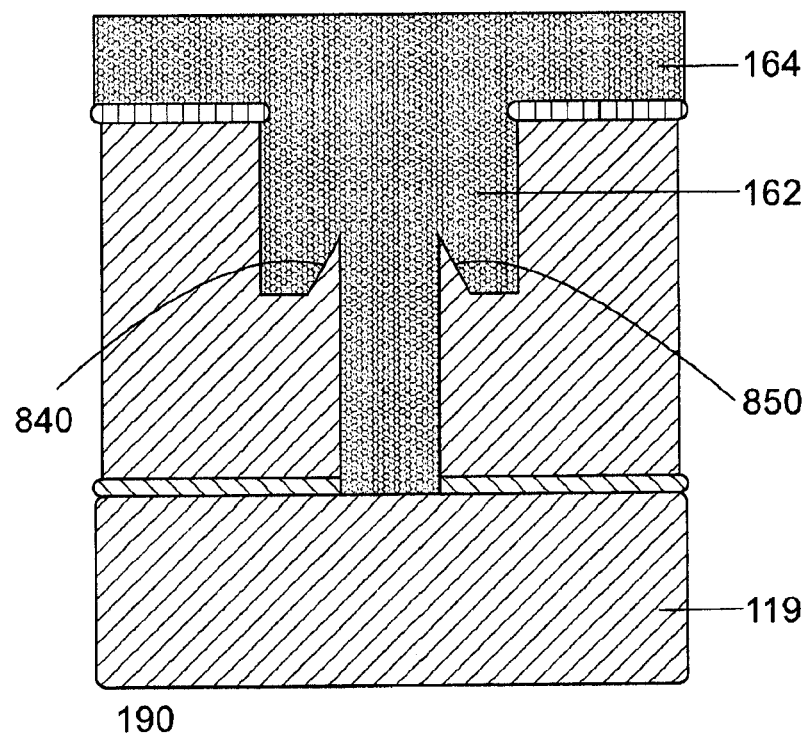
Figure 10:
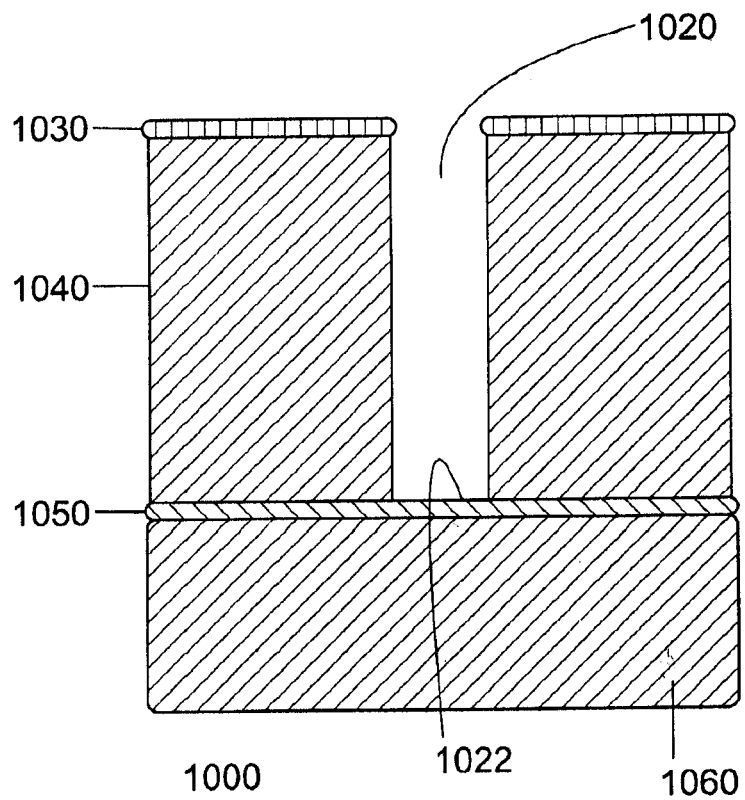
Figure 11:
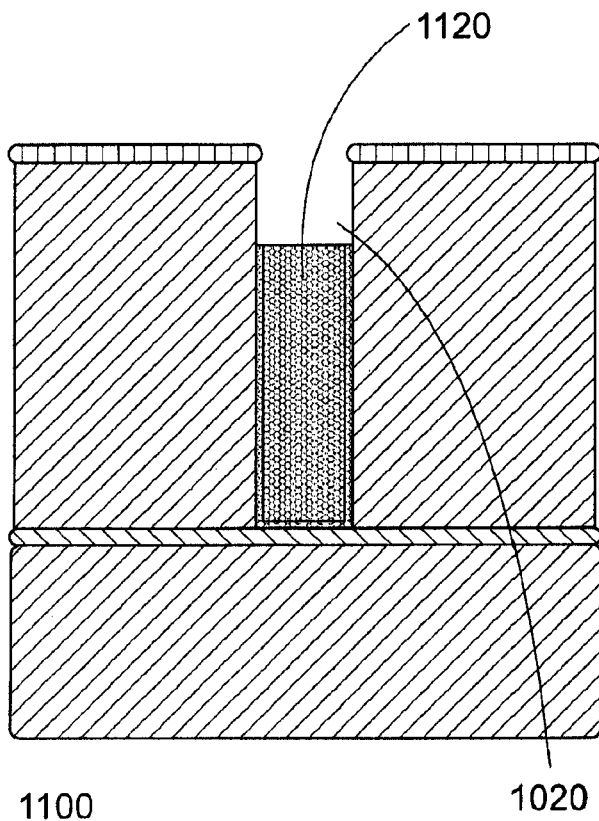
Figure 12:
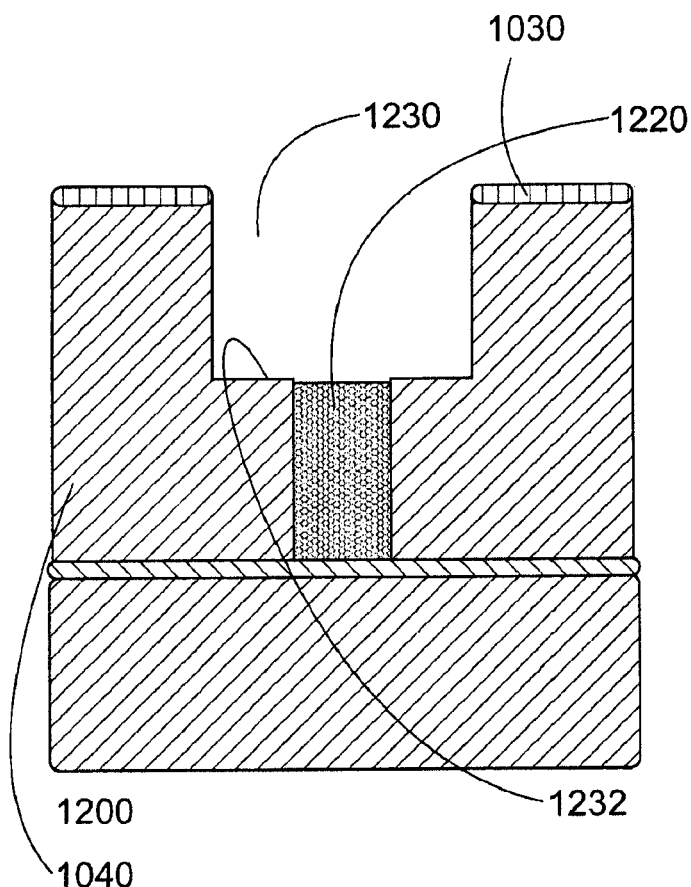
Figure 13:
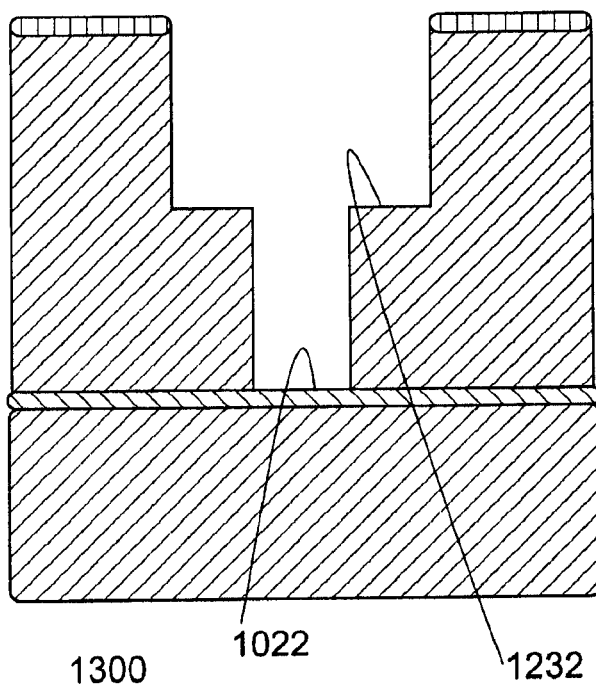
Figure 14:
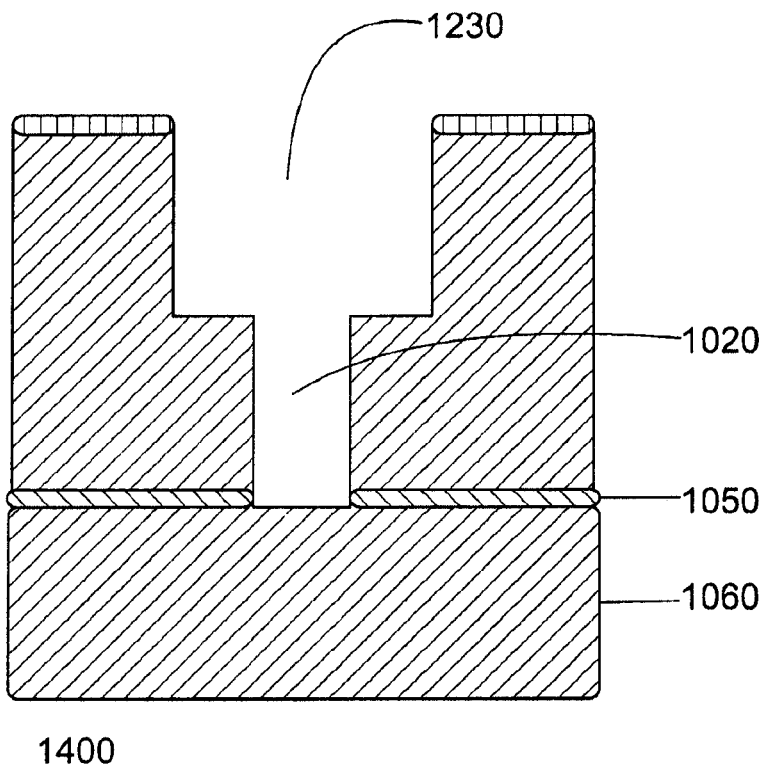
Figure 15:
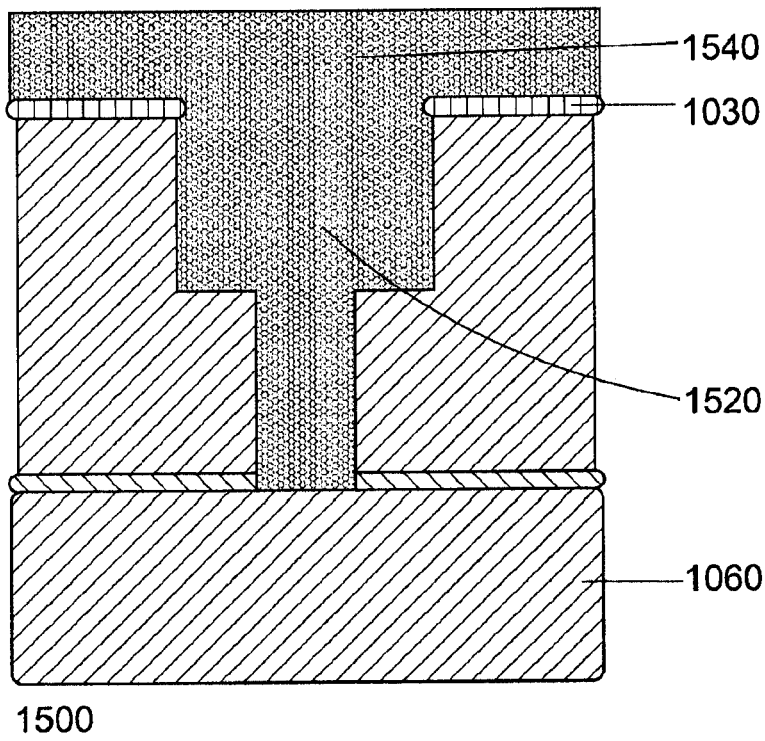
Figure 16:
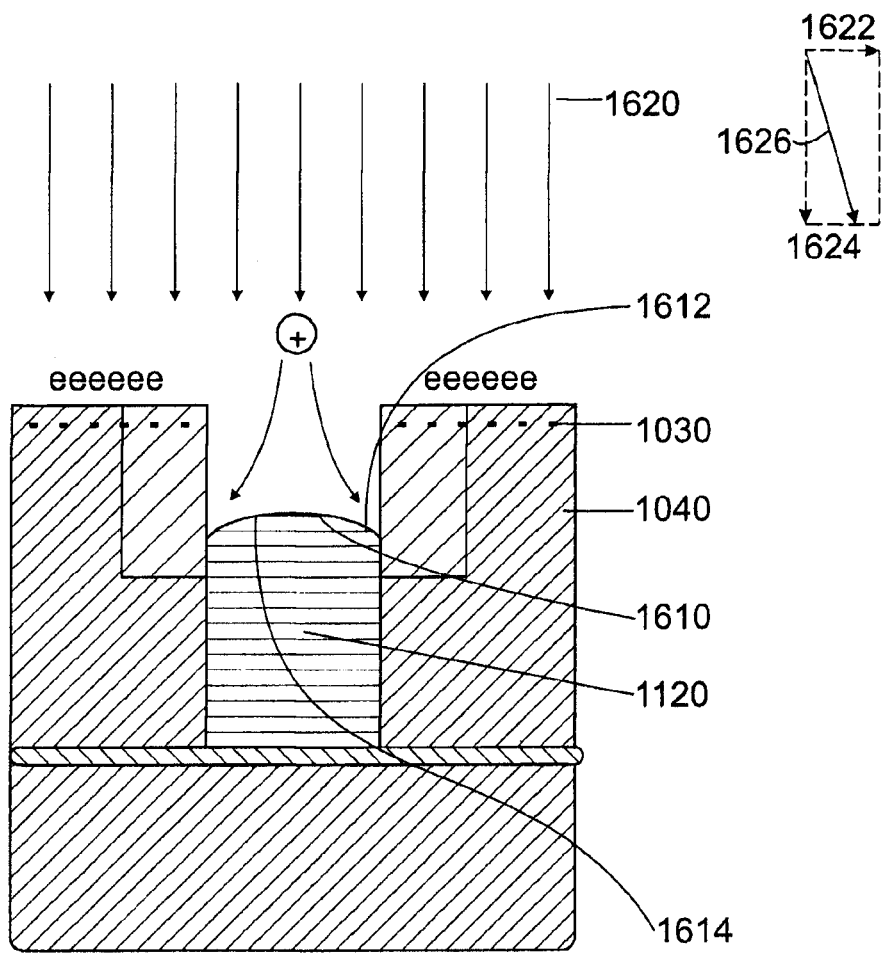

FIG. 8 is a simplified diagram for fencing effect during trench etching resulting from the method as shown in FIGS. 1-6. This diagram is merely an example, which should not unduly limit the scope of the claims herein. One of ordinary skill in the art would recognize many variations, alternatives, and modifications. Under the conventional method for forming electrical contact, at process 130 for trench etching, FSG regions 810 and 820 are removed to form trench 134. Trench 134 has trench bottom 830, which includes at least FSG spikes 840 and 850, and concave BARC top surface 860. FSG spikes 840 and 850 usually causes FSG fencing effect.

Figure 9:
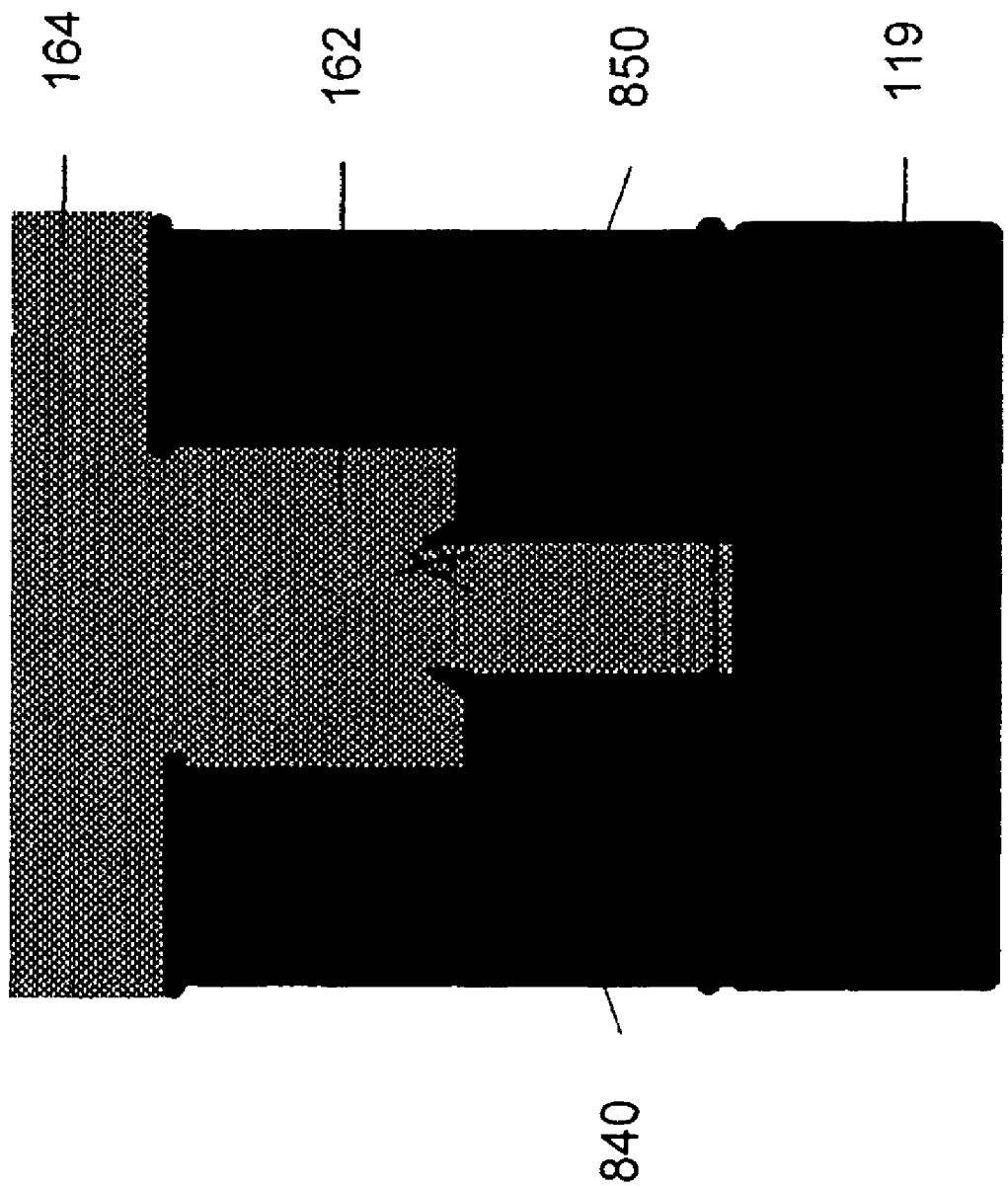
FIG. 9 is a simplified diagram for fencing effect in electrical contact resulting from the method as shown in FIGS. 1-6.

FIG. 9 is a simplified diagram for fencing effect in electrical contact resulting from the method as shown in FIGS. 1-6. This diagram is merely an example, which should not unduly limit the scope of the claims herein. One of ordinary skill in the art would recognize many variations, alternatives, and modifications. Under the conventional method for forming electrical contact, at process 160 for trench and via filling, conductive filling layer 162 is formed on spikes 840 and 850. Spikes 840 and 850 raise thermal stress of conductive filling layer 162. The thermal stress may lead to thermal breakdown under anneal during semiconductor device fabrication. Thus the yield of semiconductor manufacturing is reduced. Additionally, the thermal stress usually degrades thermal tolerance of completed semiconductor devices. The devices therefore have only limited lifetime under high temperature or can function only at limited temperature. Furthermore, spikes 840 and 850 may increase contact resistance of conductive filling layer 162, which serves as an electrical contact between metal layer 119 and metal layer 164. The increased contact resistance raises amount of power consumption and thus degrades performance of the semiconductor devices.

FIGS. 10-18 are simplified diagrams for a method of making an electrical contact between two conductive layers according to an embodiment of the present invention. These diagrams are merely examples, which should not unduly limit the scope of the claims herein. The method includes the following processes:

1. Process 1000 for via etching;
2. Process 1100 for BARC etchback with profile control;
3. Process 1200 for trench etching with profile control;
4. Process 1300 for ashing;
5. Process 1400 for stop layer removal;
6. Process 1500 for trench and via filling.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 10:
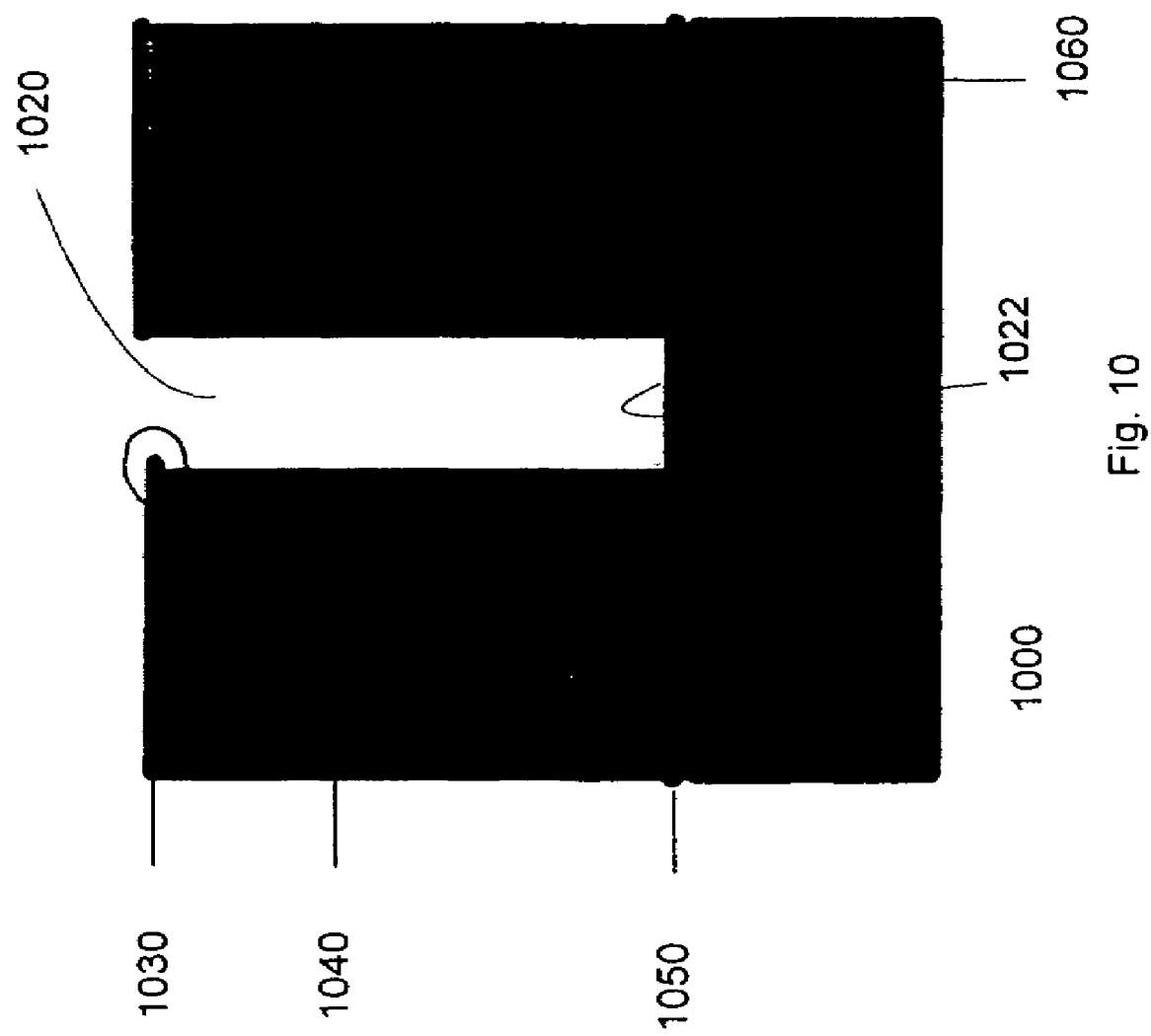
FIGS. 10-18 are simplified diagrams for a method of making an electrical contact between two conductive layers according to an embodiment of the present invention.
Figure 11:
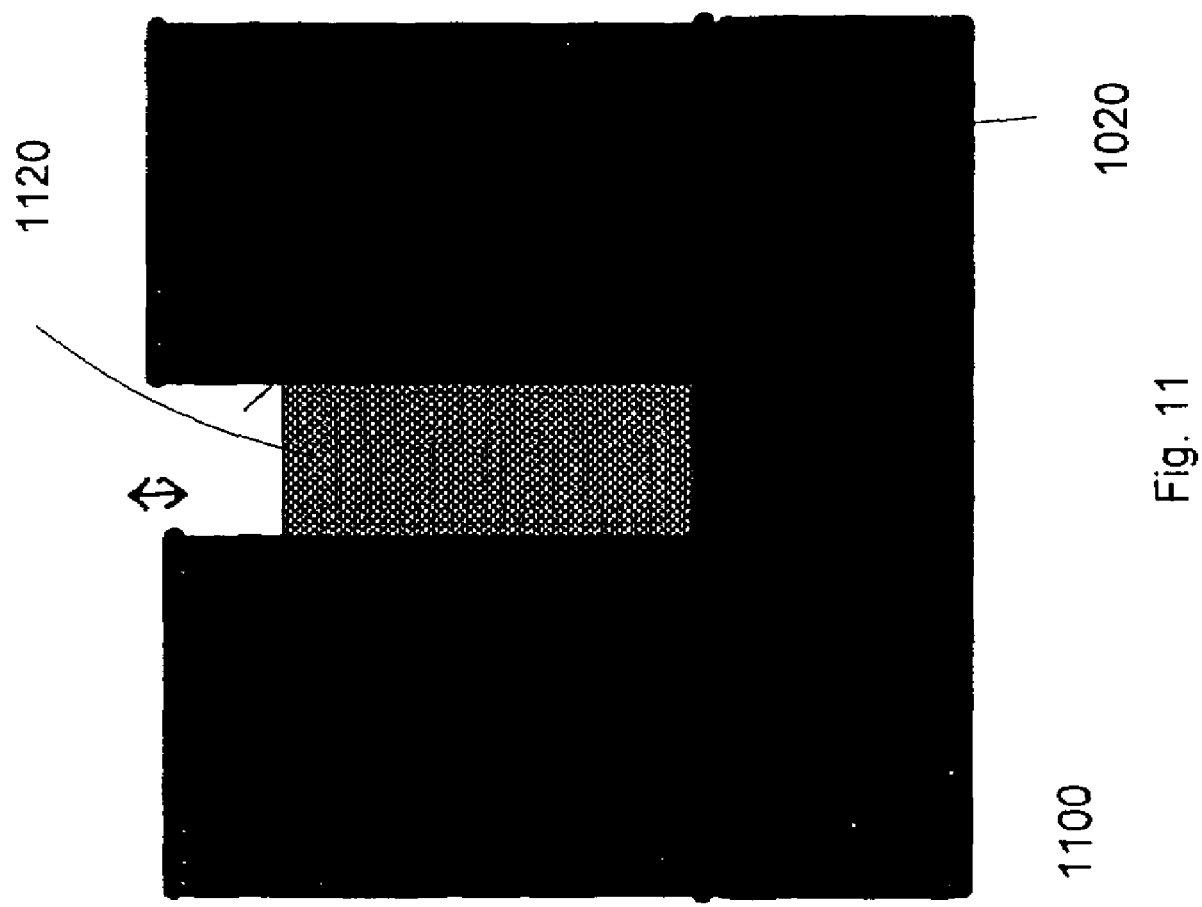
Figure 12:
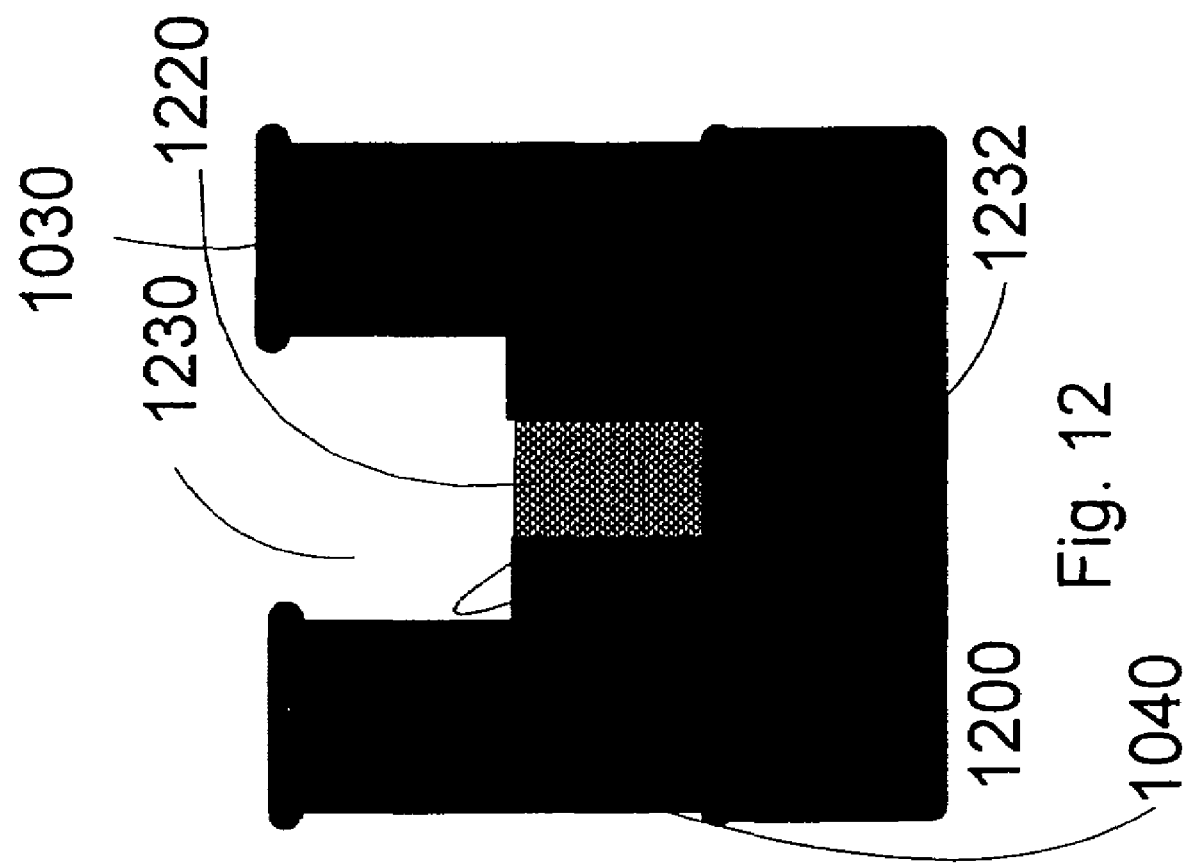
Figure 13:
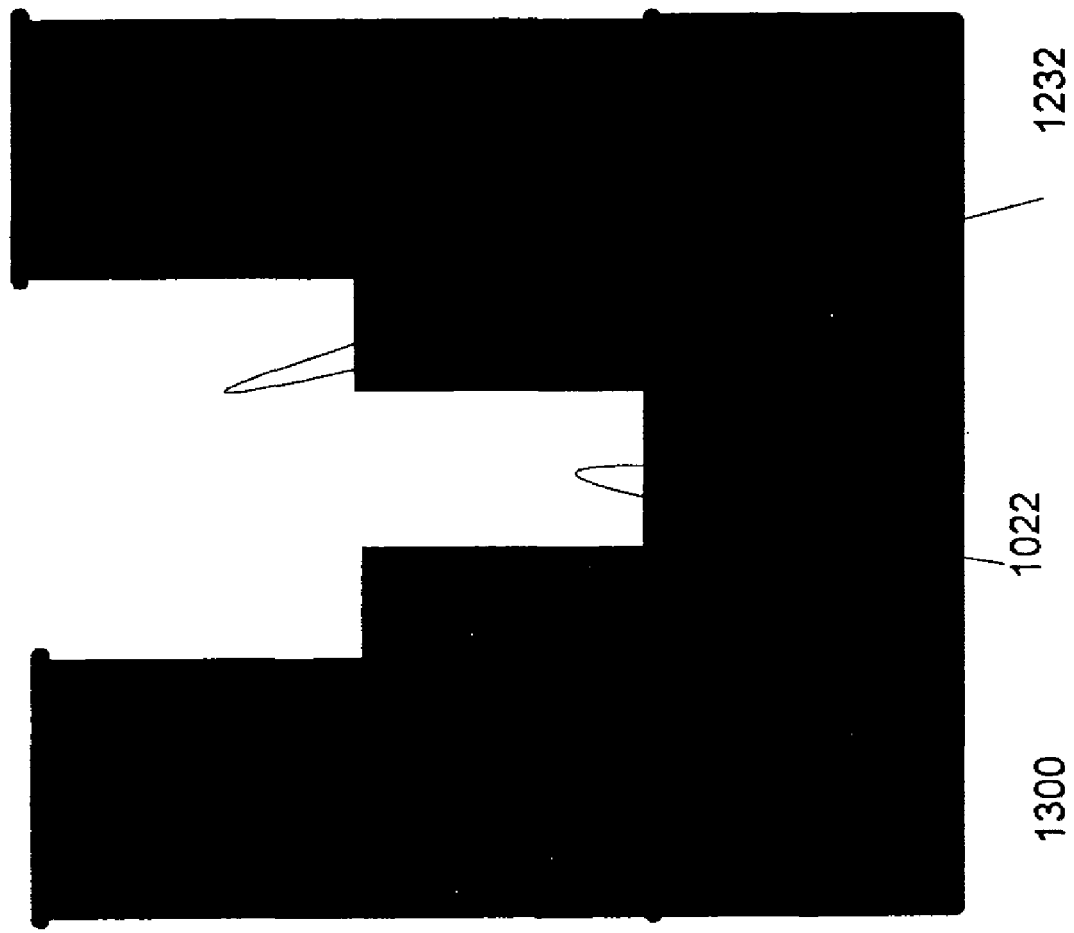
Figure 14:
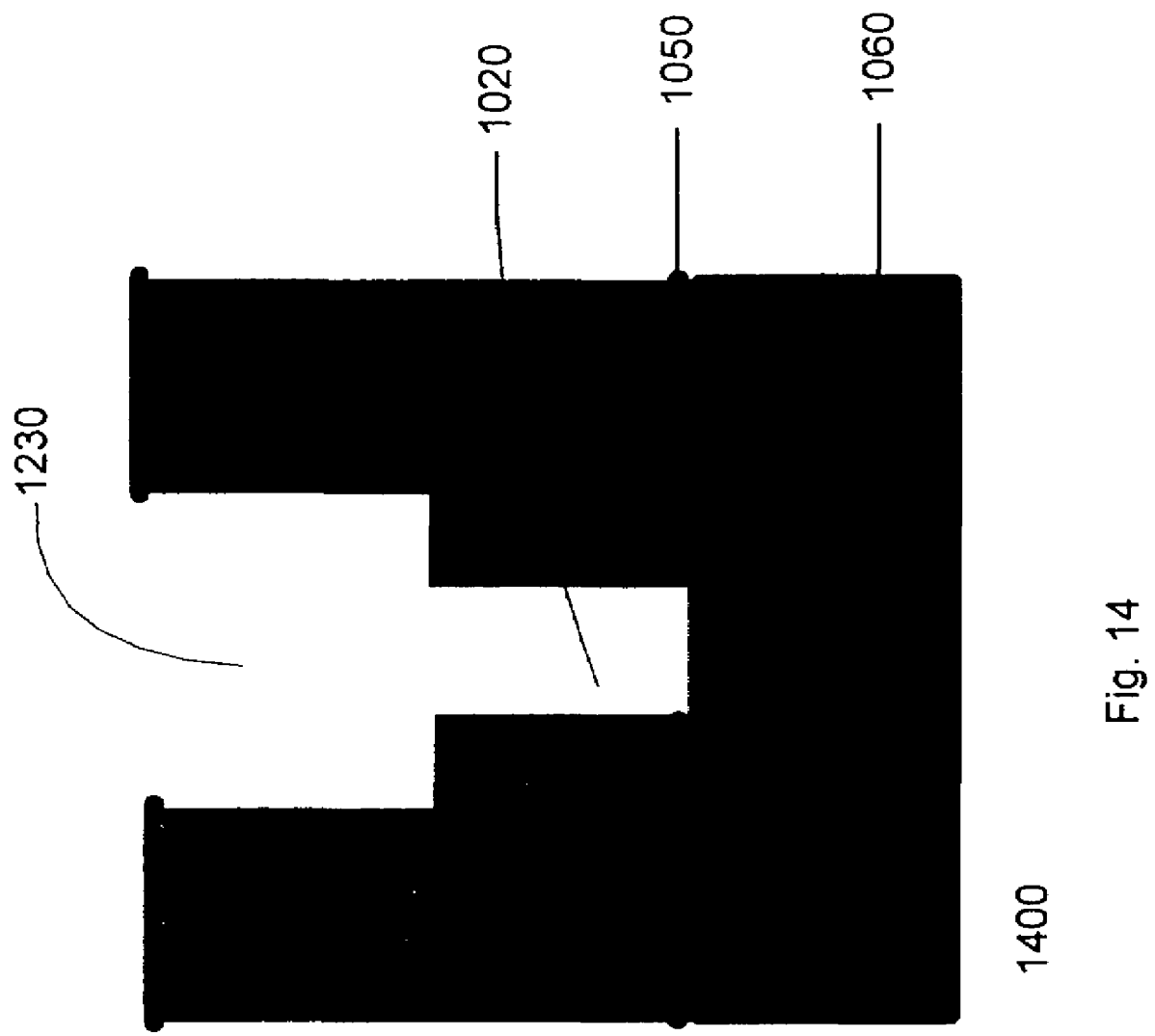
Figure 15:
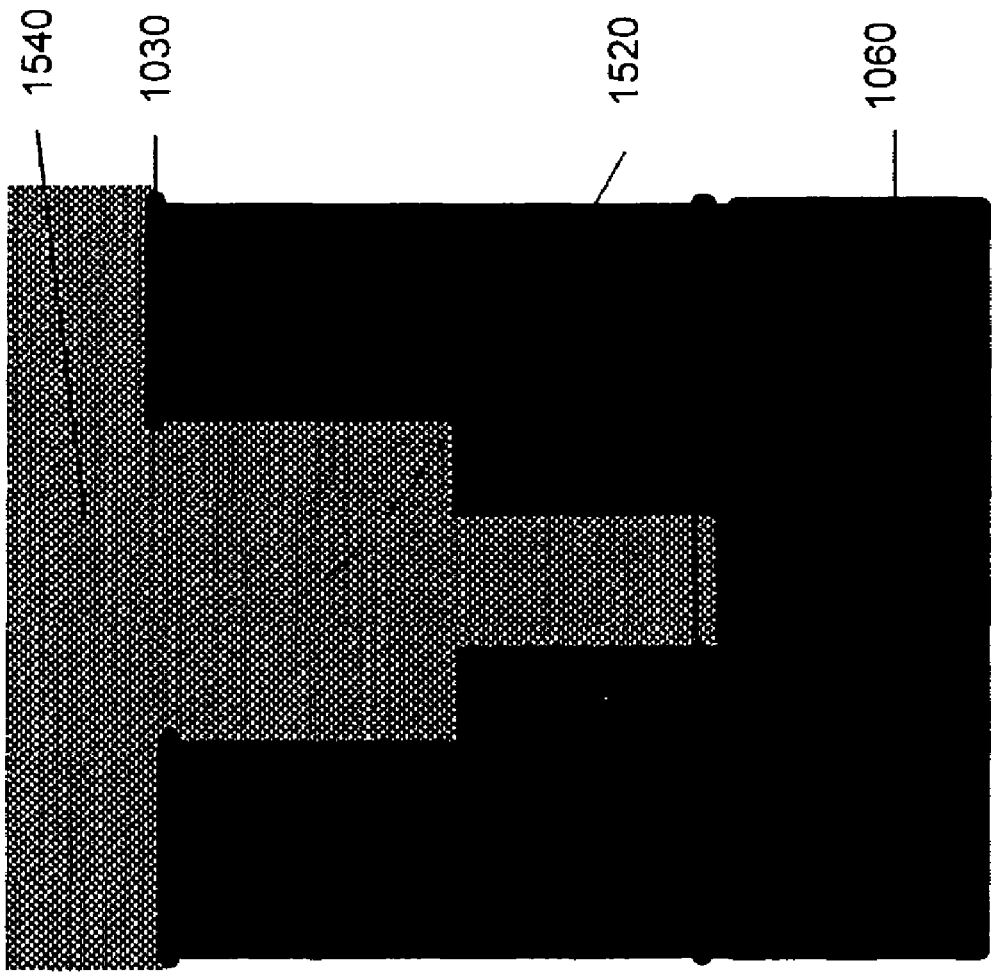

At process 1000 for via etching, via 1020 is fabricated through protective layer 1030 and dielectric layer 1040. The fabrication process usually uses a conventional dry etch process. Protective layer 1030 is located on the surface of dielectric layer 1040. For example, protective layer 1030 is made of silicon oxynitride, silicon nitride, silicon oxide, other protective material, or combination thereof. Dielectric layer 1040 may be made of silicon oxide, FSG, silicon nitride, other dielectric material, or combination thereof. FSG is usually composed of silicon oxide and fluorine. Alternatively, protective layer 1030 and dielectric layer 1040 may be combined into one layer. One or several additional layers may be inserted between protective layer 1030 and dielectric layer 1040 or/and on the top surface of protective layer 1030. As shown in FIG. 10, via 1020 has via bottom 1022 formed by a portion of stop layer 1050. For example, stop layer 1050 is made of silicon nitride, silicon oxide, silicon oxynitride, other material, or combination thereof. Another portion of stop layer 1050 lies under dielectric layer 1040. Alternatively, stop layer 1050 and dielectric layer 1040 may be combined into one layer. One or several additional layers may be inserted between stop layer 1050 and dielectric layer 1040 or/and below the bottom surface of stop layer 1050. As shown in FIG. 10, stop layer 1050 is deposited on the surface of conductive layer 1060. Conductive layer 1060 may be composed of copper, aluminum, tungsten, polysilicon, other conductive material, or combination thereof.

At process 1100 for BARC etchback, a BARC layer fills via 1020 and is then etched back to form BARC layer 1120. Before the etchback, the BARC layer may fill via 1020 completely or only partially. Also, the BARC layer may overflow out of via 1020 prior to the etchback. BARC layer 1120 is usually composed of conventional photoresist. For example, BARC is composed of photoresist alike material, organic material, DUO 193/248, other material, or combination thereof. The etchback process uses a dry etch technique utilizing oxygen, other type of gas, or combination thereof.

Figure 16:
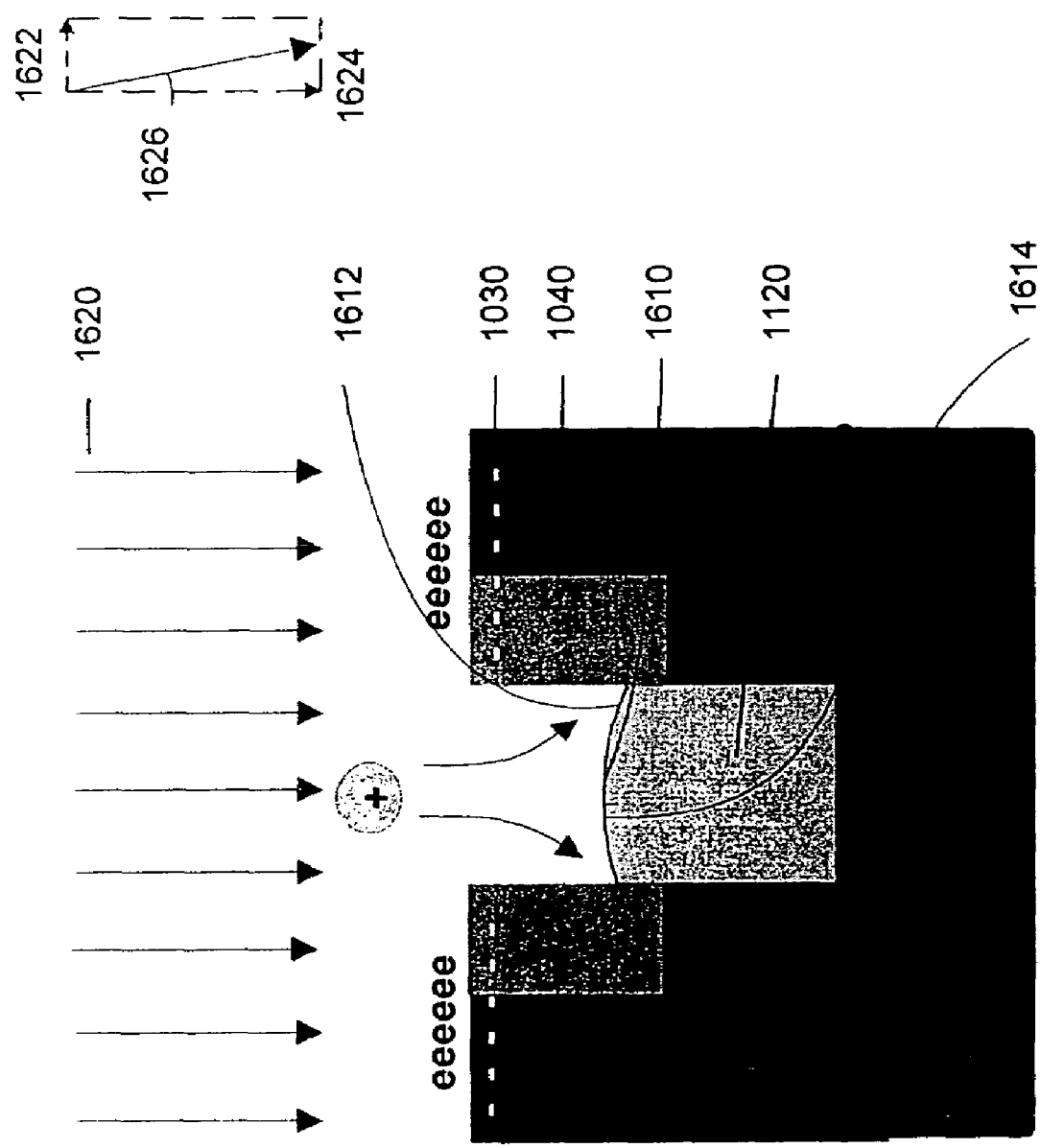

According to an embodiment of the present invention, process 1100 uses an electron temperature at least as high as 4 eV in plasma reactor in order to avoid concave top surface 124 as shown in FIG. 7. Preferably, the electron temperature should exceed 4 eV but remain below 10 eV. To raise the electron temperature above 4 eV, the gas pressure within the plasma chamber should be decreased to below 40 mTorr. Alternatively, other means to raise the electron temperature may be employed. As shown in FIG. 16, the low gas pressure also improves anisotropy of ion flux 1620. Ions of ion flux 1620 usually contains ions with horizontal velocity component 1622 and vertical velocity component 1624. The ratio of horizontal velocity component 1622 to vertical velocity component 1624 determines angle 1626. The average magnitude of angle 1626 for all ions of ion flux 1620 is, for example, 5-10 degrees, and preferably below 5 degrees. Moreover, the plasma density within the plasma chamber exceeds $5 \times 10^{16}$ ions/m$^3$.

FIG. 16 is a simplified diagram for convex profile of BARC layer resulting from process conditions as discussed in the preceding paragraph according to one embodiment of the present invention. This diagram is merely an example, which should not unduly limit the scope of the claims herein. One of ordinary skill in the art would recognize many variations, alternatives, and modifications. At process 1100 for BARC etchback, BARC etchback layer 1120 usually has convex, instead of concave, top surface 1610. Convex top surface 1610 has peripheral region 1612 around side surfaces of protective layer 1030 and dielectric layer 1040 and central region 1614 around the center of via 1020. Peripheral region 1612 is usually located lower, instead of higher, than central region 1614.

Convex top surface 1610 may have resulted from one or several etching mechanisms. The ions with relatively small angel 1626 can easily reach peripheral region 1612; therefore the etch rate at peripheral region 1612 does not significantly differ from at central region 1614. Additionally, the plasma used for process 1100 has a high plasma density as discussed above, so the electron density on the surface of protective layer 1030 is large. Consequently the high negative charge density around side surfaces of protective layer 1030 and dielectric layer 1040 can effectively attract positive ions to peripheral region 1612 and thereby increase the etch rate in this region. The high etch rate makes peripheral region 1612 lower than central region 1614, and thereby forms convex top surface 1610.

At process 1200 for trench etching, BARC layer 1120 is further etched back to form BARC layer 1220. Additionally, a portion of protective layer 1030 and a portion of FSG layer 1020 are removed to form trench 1230. Trench 1230 has trench bottom 1232, a portion of which is composed of BARC and another portion of which is composed of dielectric material, such as FSG. According to an embodiment of the present invention, process 1200 uses a dry etch technique utilizing a mixed gas composed of fluorine based gas and oxygen based gas. The fluorine based gas may be $CF_4$, $C_2F_6$, $C_4F_8$, other gas, or combination thereof. The oxygen based gas may be $O_2$, other gas, or combination thereof. The fluorine based gas accounts for a certain volume percentage of the mixed gas. For example, the volume percentage ranges from 90% to 100%.

Figure 17:
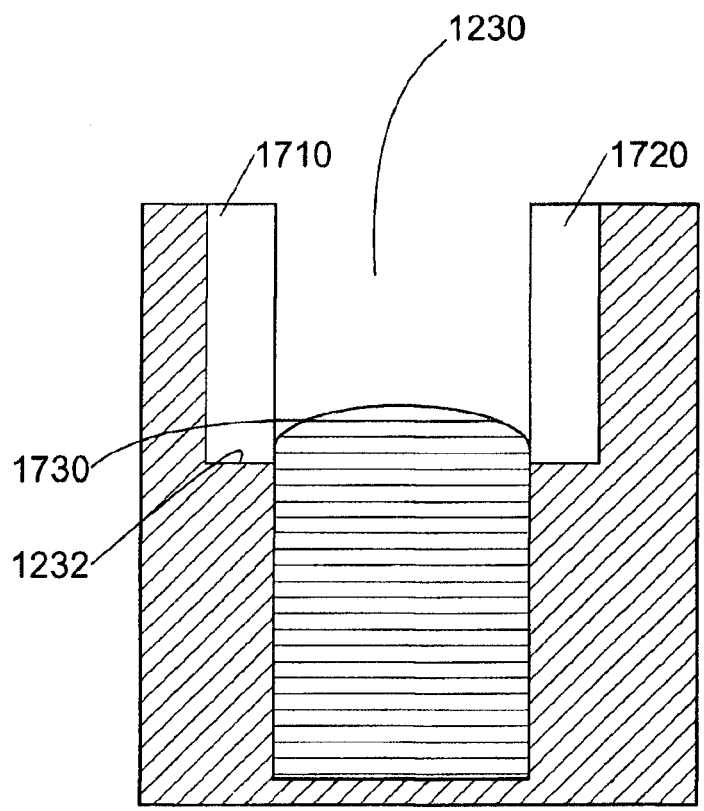
Figure 18:
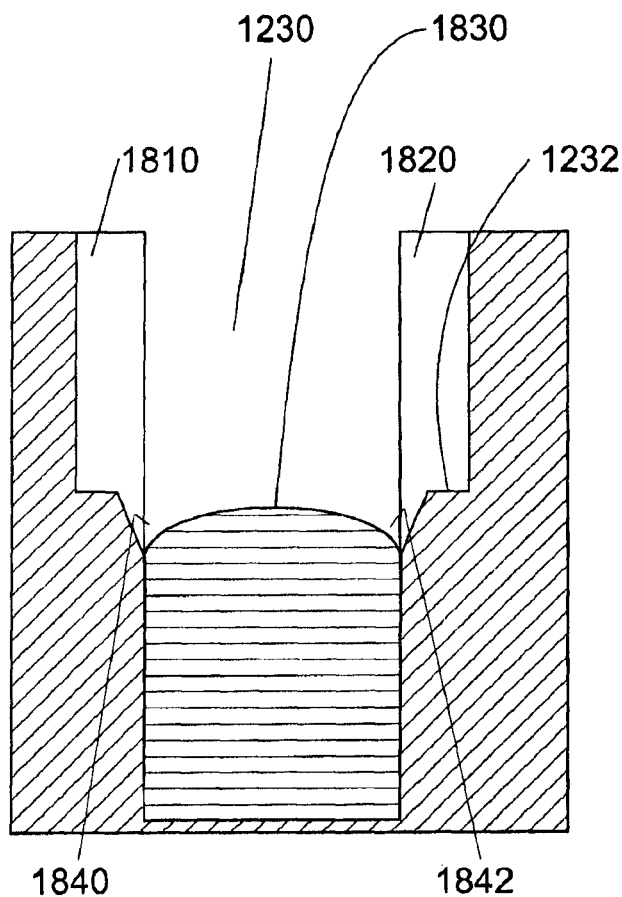
Figure 1:
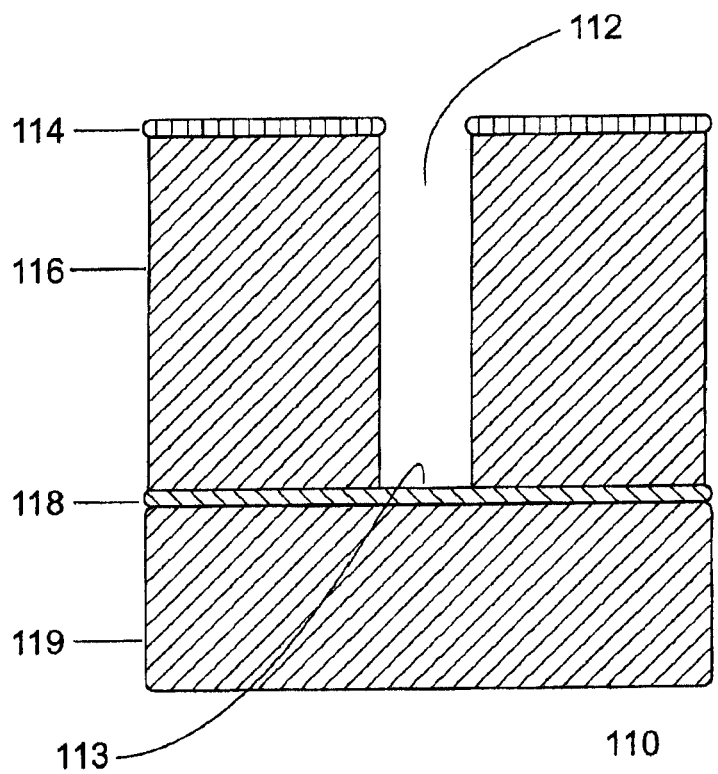
Figure 2:
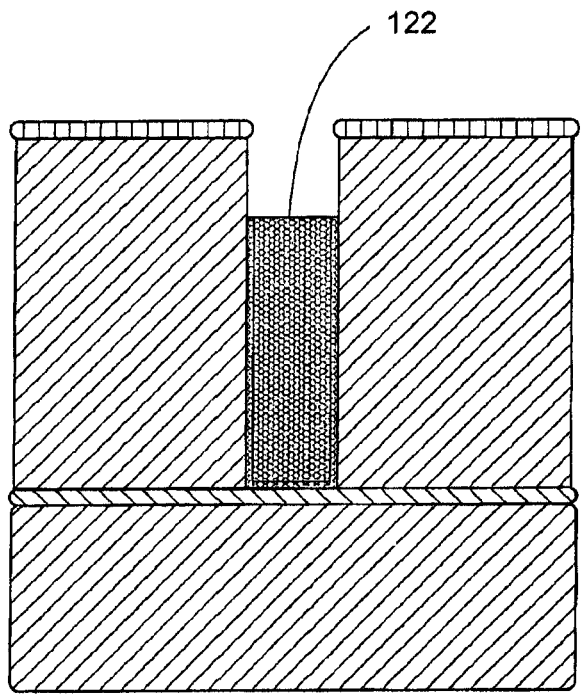
Figure 3:
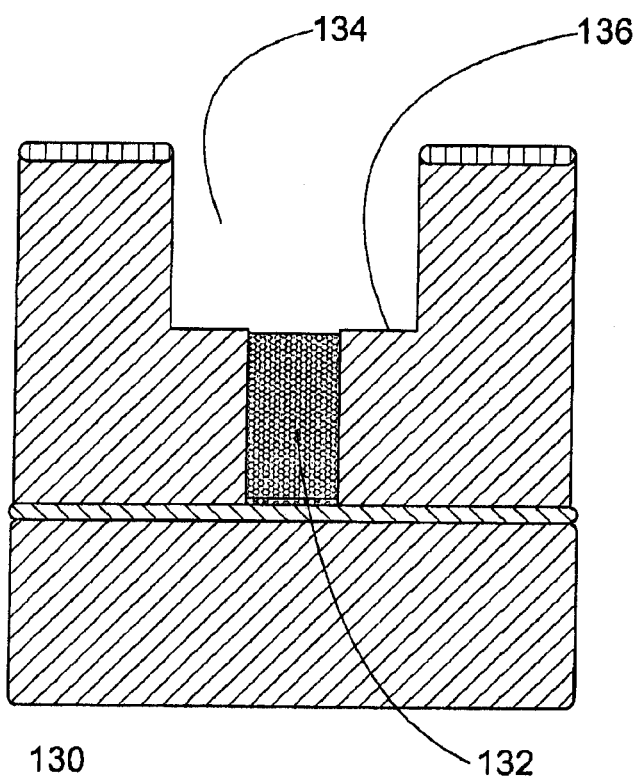
Figure 4:
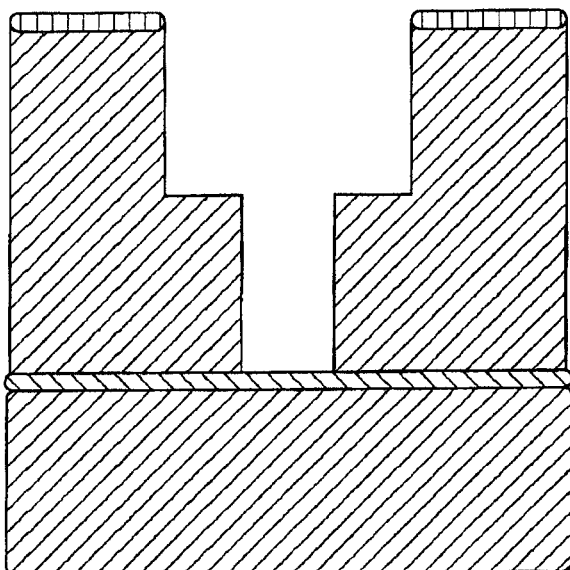
Figure 5:
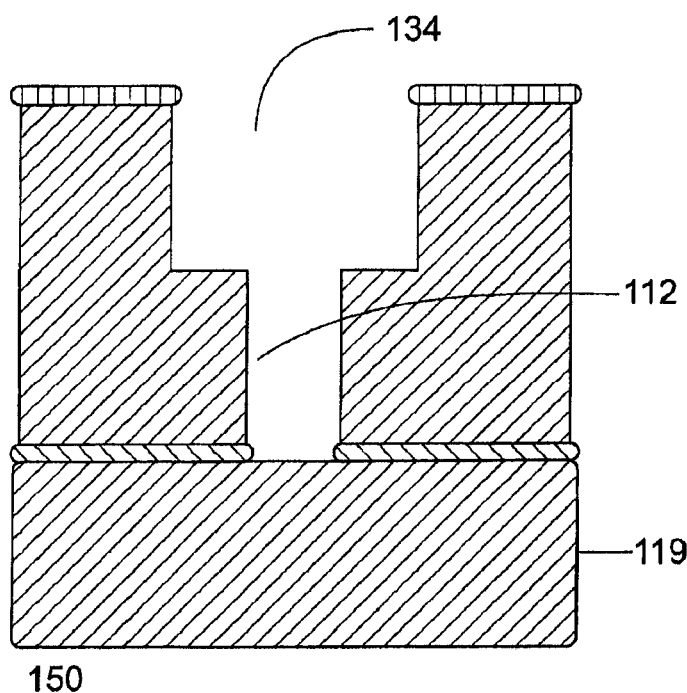
Figure 6:
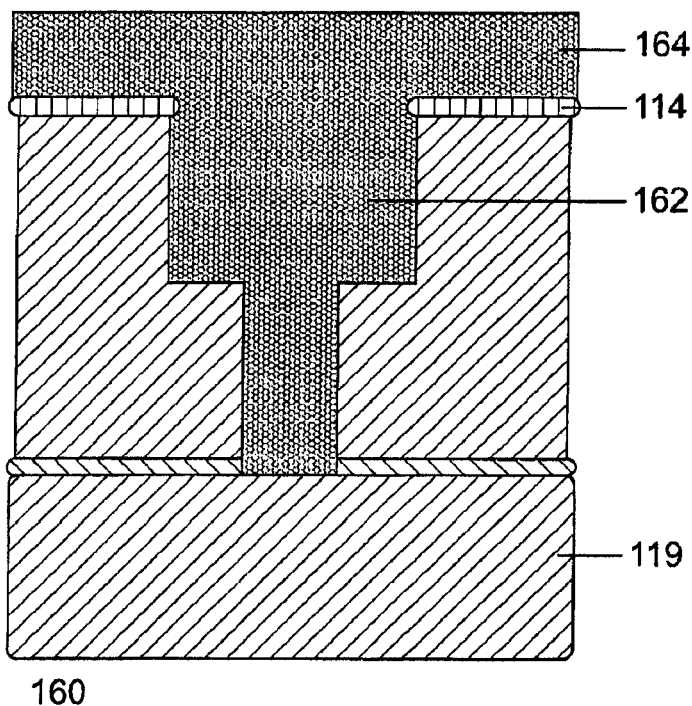
Figure 7:
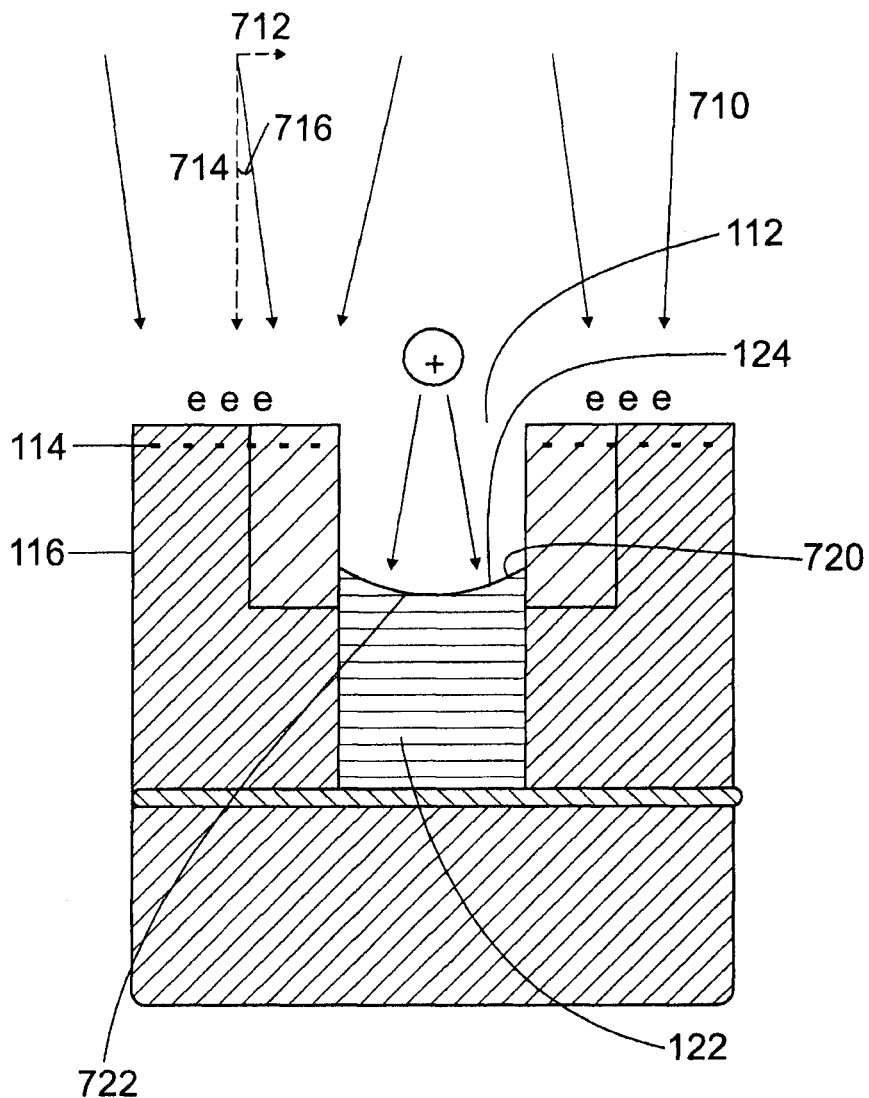
Figure 8:
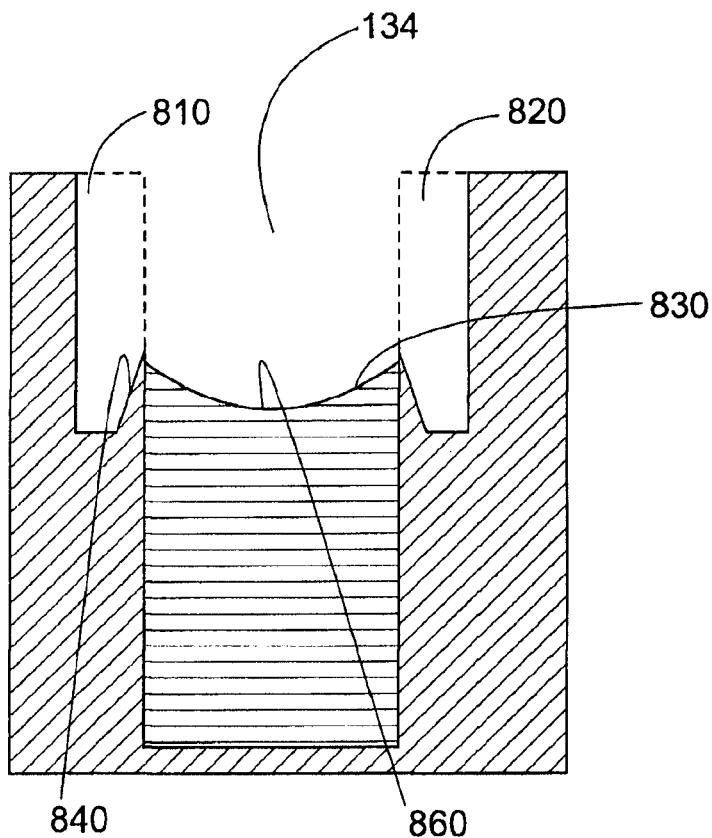
Figure 9:
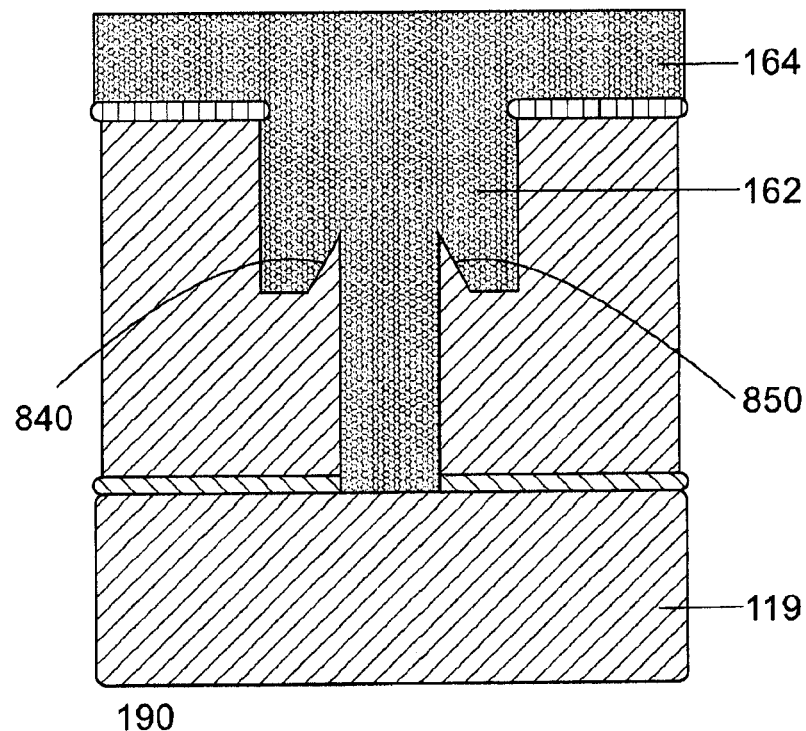
Figure 10:
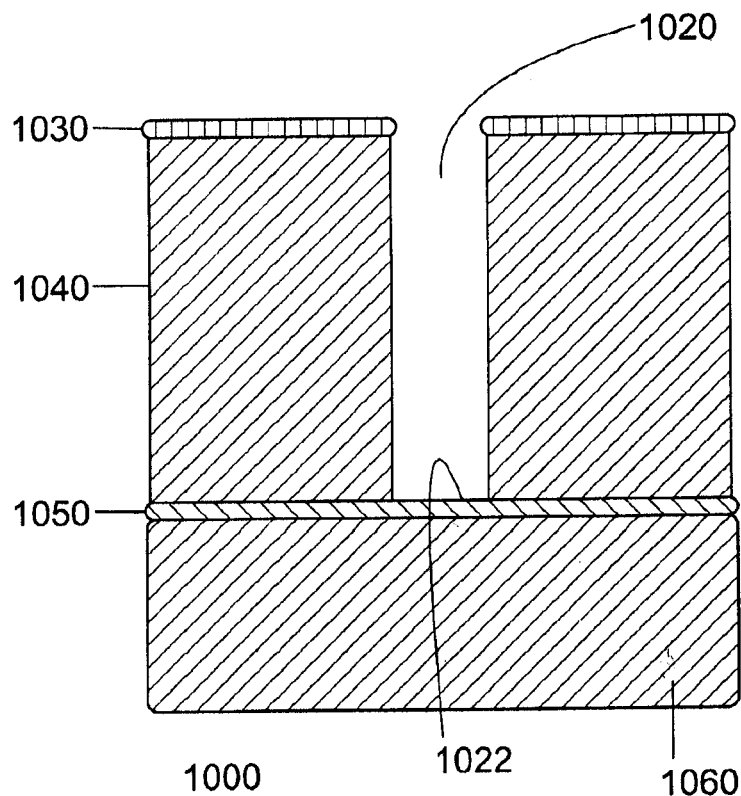
Figure 11:
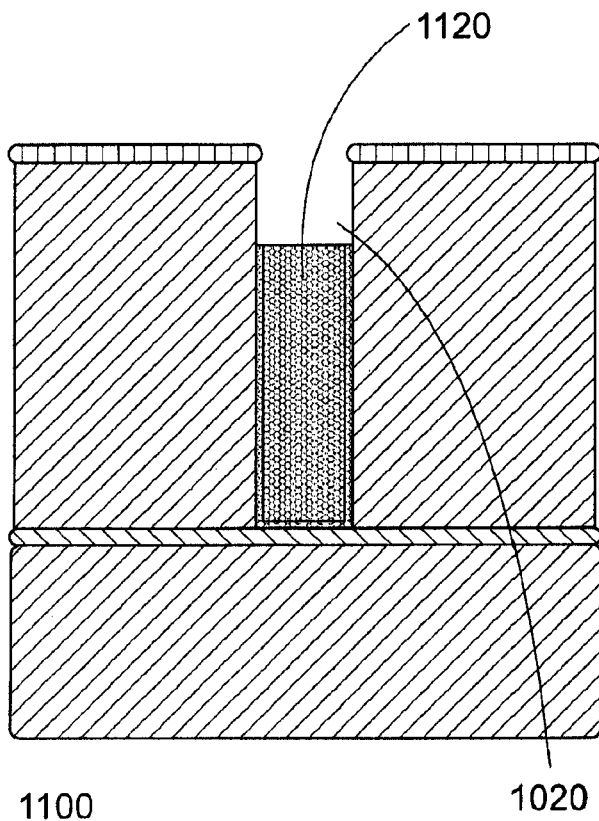
Figure 12:
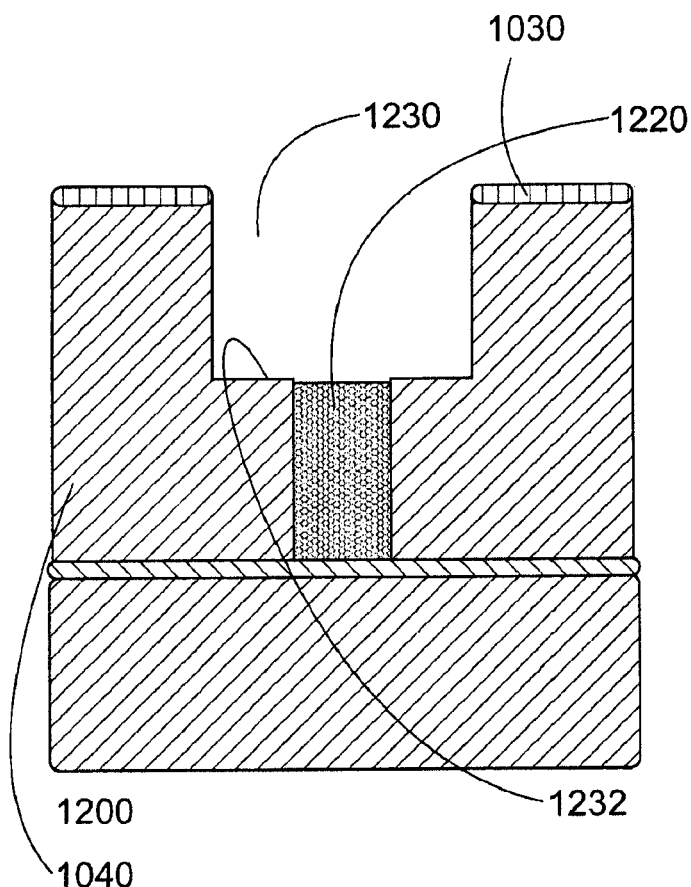
Figure 13:
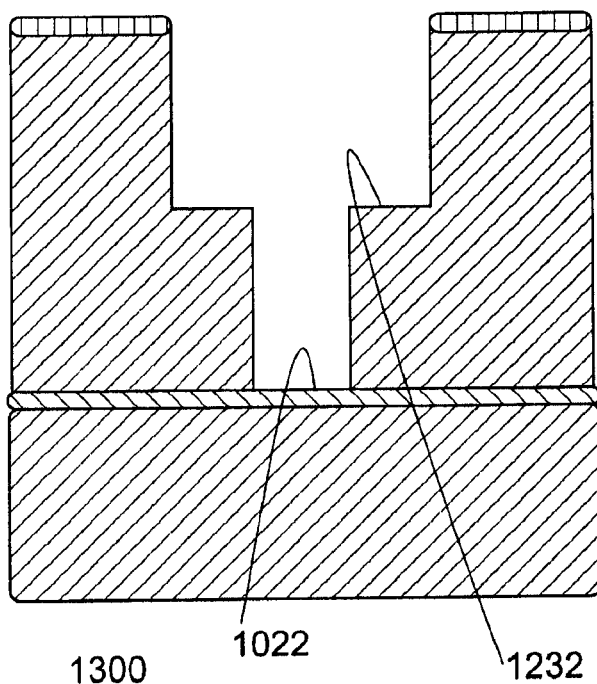
Figure 14:
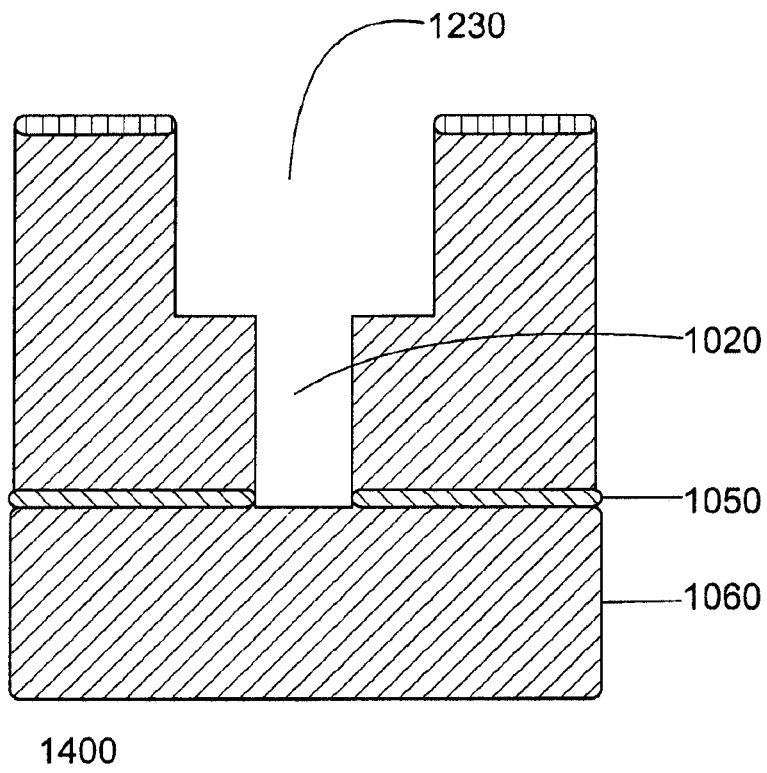
Figure 15:
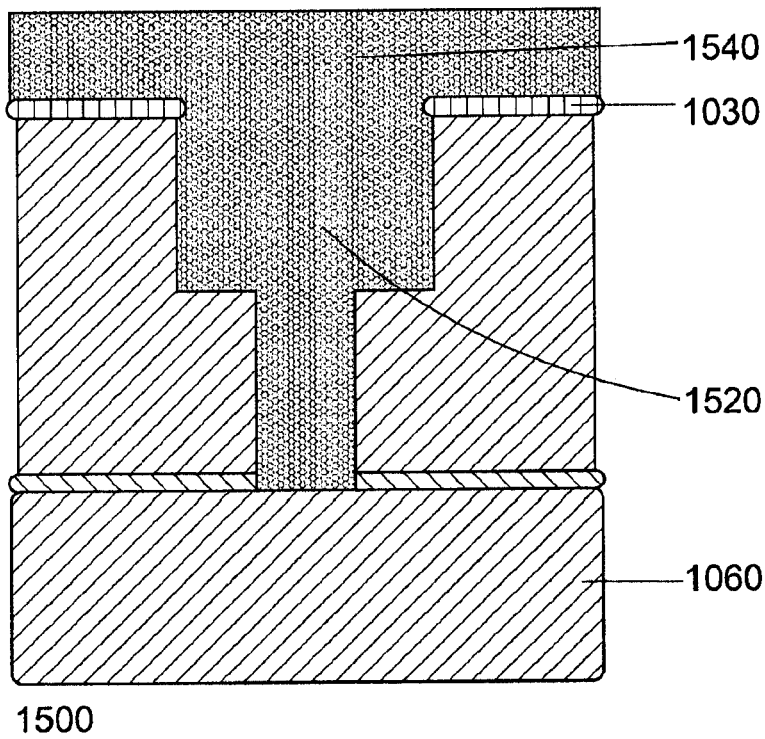
Figure 16:
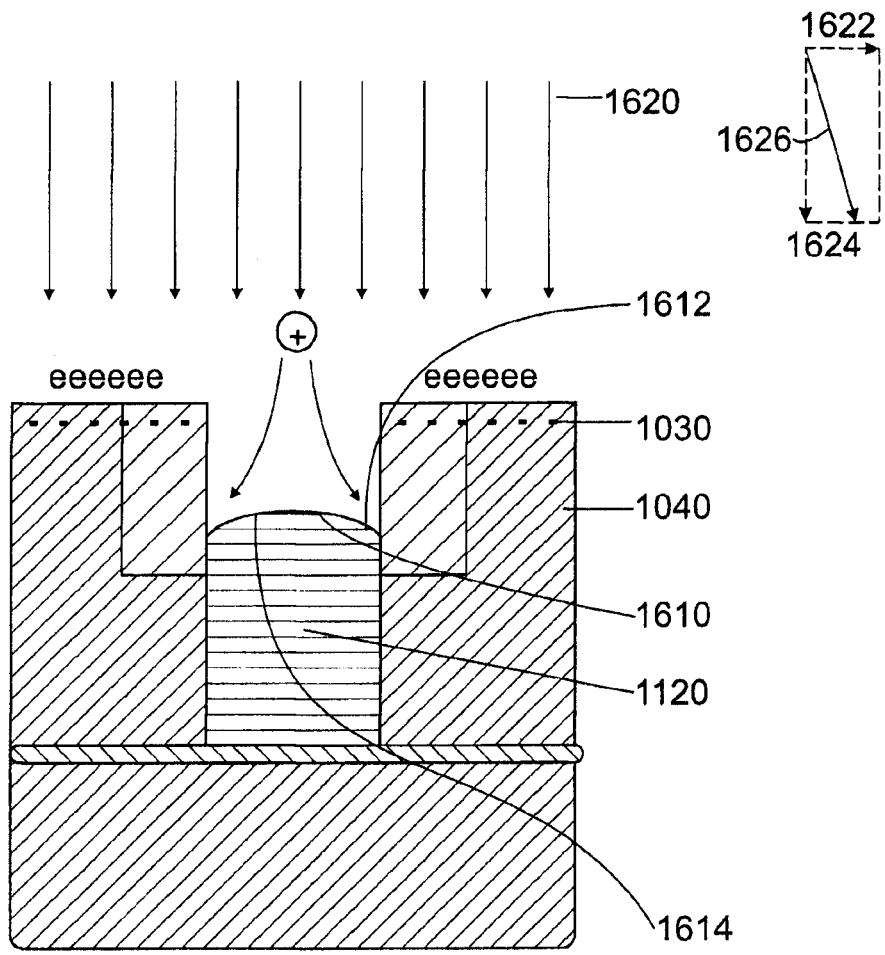
Figure 17:
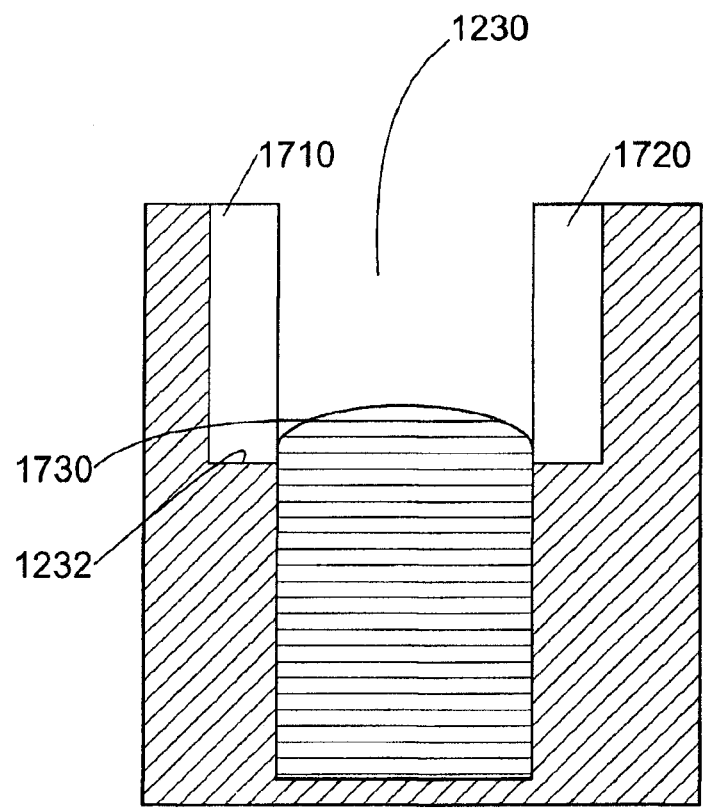
Figure 18:
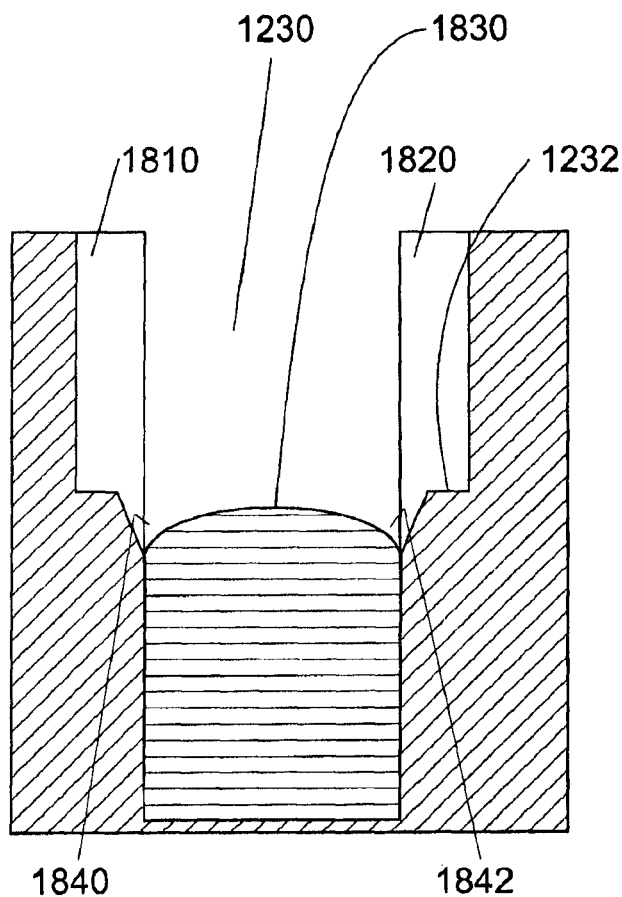

FIG. 17 is a simplified diagram showing lack of fencing effect during trench etching according to one embodiment of the present invention. This diagram is merely an example, which should not unduly limit the scope of the claims herein. One of ordinary skill in the art would recognize many variations, alternatives, and modifications. At process 1200 for trench etching, dielectric regions 1710 and 1720 are removed in order to form trench 1230. Trench 1230 has trench bottom 1232, which includes convex BARC top surface 1730. As shown in FIG. 17, trench bottom 1232 does not have any spikes that usually result from the conventional method as described in FIG. 8. Hence the fencing effect can be largely eliminated.

Figure 18:
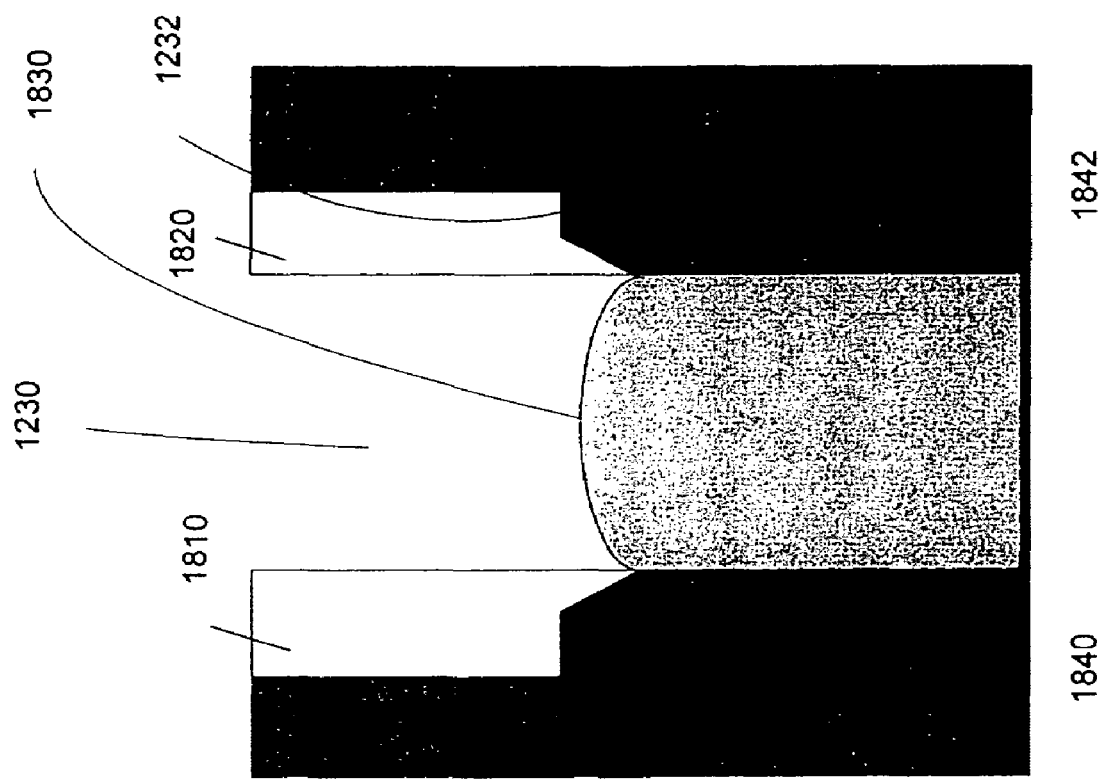
Figure 1:
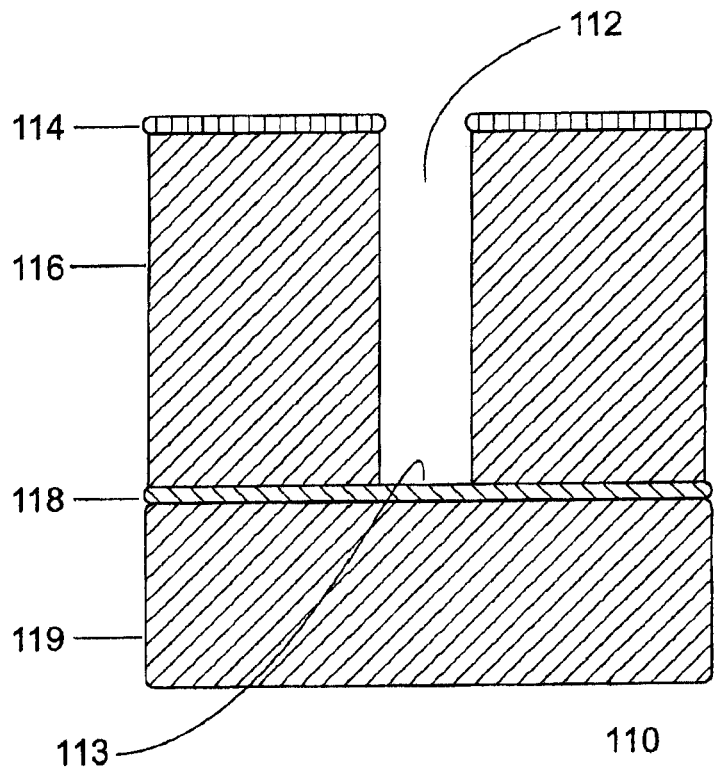
Figure 2:
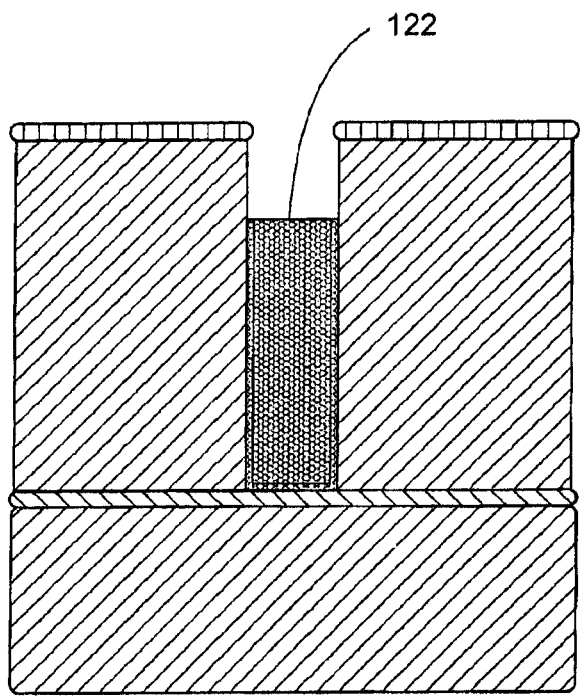
Figure 3:
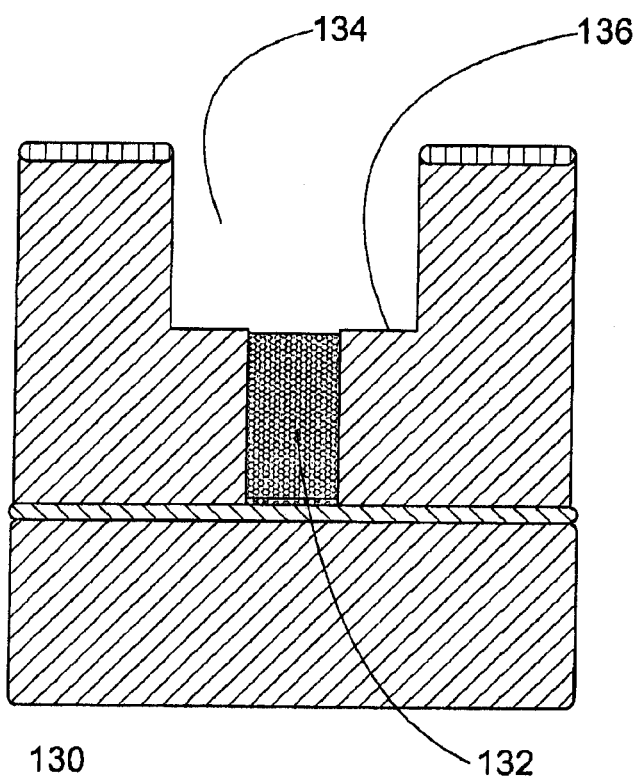
Figure 4:
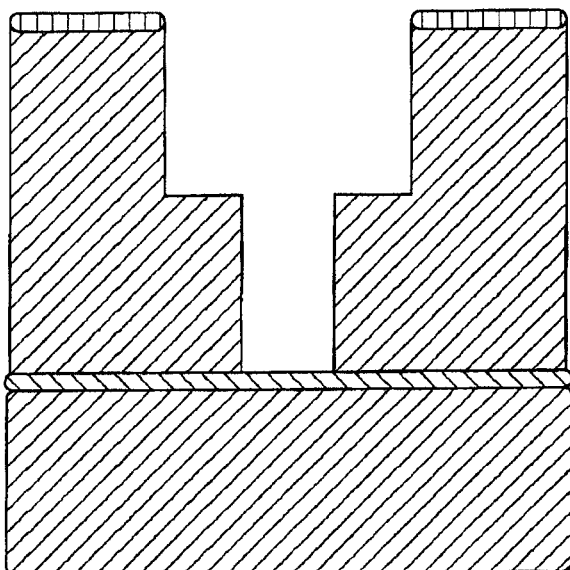
Figure 5:
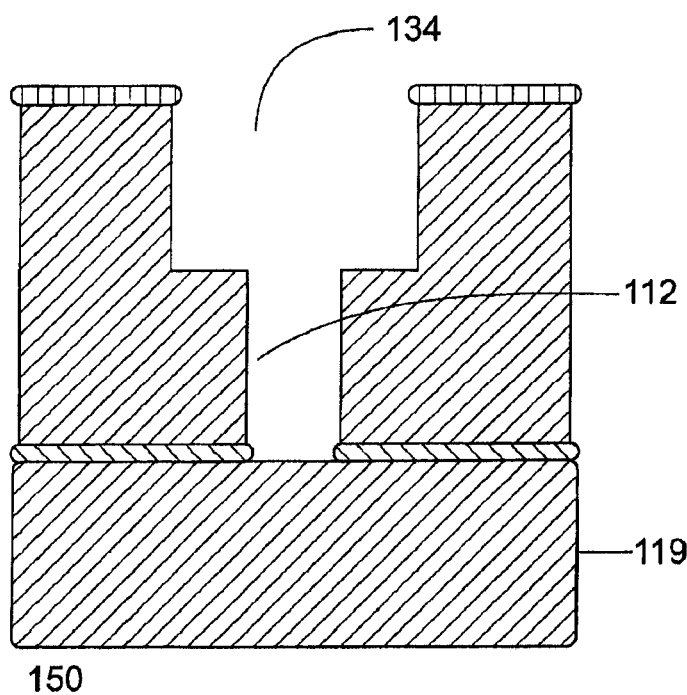
Figure 6:
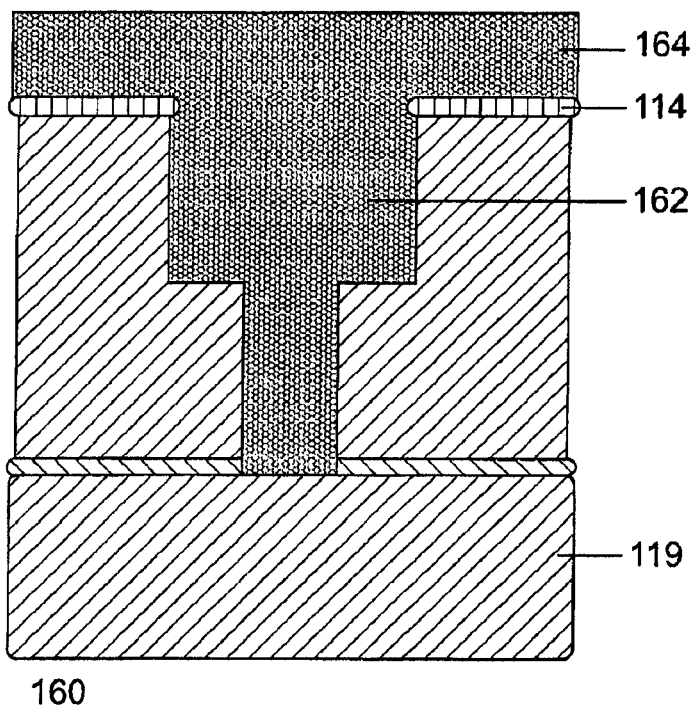
Figure 7:
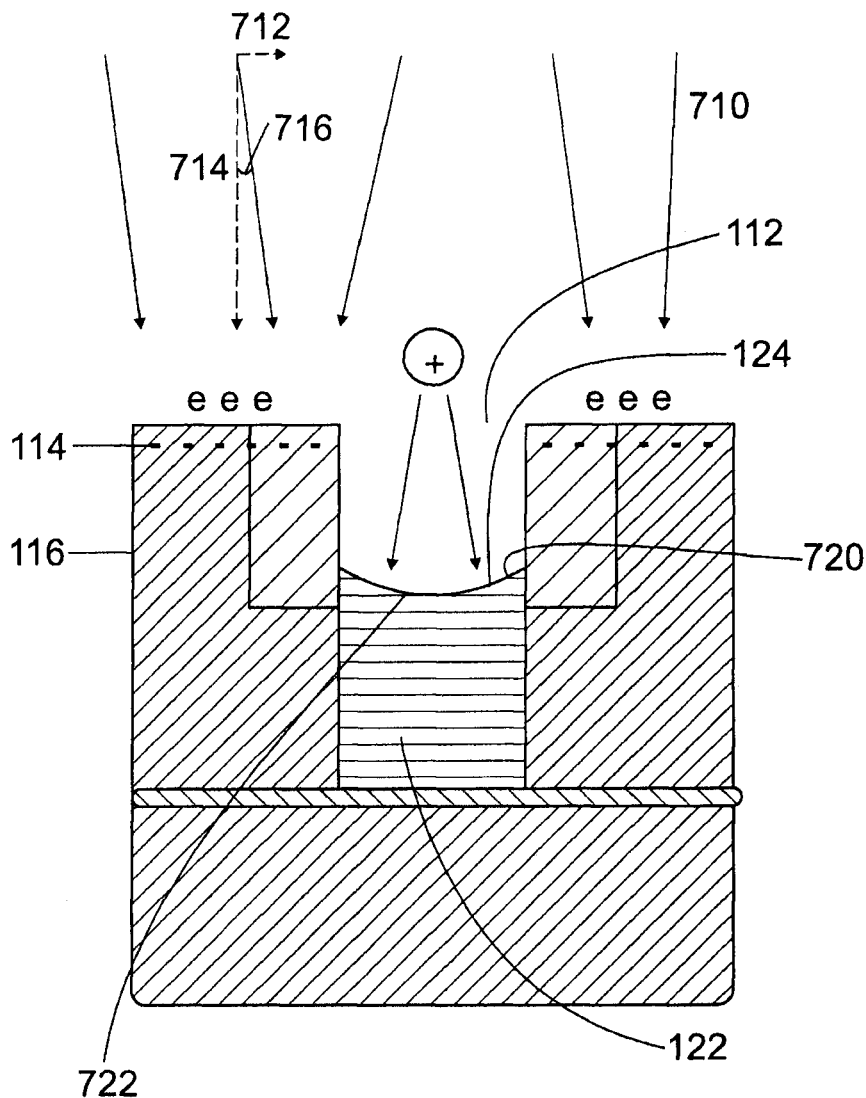

FIG. 18 is a simplified diagram showing lack of fencing effect during trench etching according to another embodiment of the present invention. This diagram is merely an example, which should not unduly limit the scope of the claims herein. One of ordinary skill in the art would recognize many variations, alternatives, and modifications. At process 1200 for trench etching, dielectric regions 1810 and 1820 are removed in order to form trench 1230. Trench 1230 has trench bottom 1232, which includes convex BARC top surface 1830. As shown in FIG. 18, trench bottom 1232 does not have any spikes resulting from convention method as described in FIG. 8, but rather trench bottom 1232 includes valley regions 1840 and 1842. Hence the fencing effect is substantially eliminated.

At process 1300 for ashing, BARC layer 1220 is removed from via 1020. Trench bottom 1232 does not contain spikes that usually result from the conventional method. For example, the ashing process uses a dry etch technique. The dry etch may utilize oxygen gas and generates an etch rate for BARC layer 1220 about one hundred times higher than an etch rate for dielectric layer 1040. Other etch processes can also be used.

At process 1400 for stop layer removal, the part of stop layer 1050 that forms via bottom 1022 is removed. Consequently, metal layer 1060 is exposed within via 1020 and trench 1230. For example, stop layer 1050 is composed of silicon nitride, and stop layer removal may uses fluorine based gas. The fluorine based gas may be $CF_4$, $C_2F_6$, $C_4F_8$, other gas, or combination thereof.

At process 1500 for trench and via filling, via 1020 and trench 1230 are filled with conductive material to form conductive filling layer 1520. The conductive material may be copper, aluminum, tungsten, polysilicon, other conductive material, or combination thereof. Conductive filling layer 1520 forms an electrical contact between conductive layer 1060 and conductive layer 1540. Part of conductive layer 1540 lies on the surface of protective layer 1030. Conductive layers 1540 and 1060 may be composed of copper, aluminum, tungsten, polysilicon, other conductive material, or combination thereof. Conductive layers 1540 and 1060 may have the same or different compositions. The top surface may be polished by chemical mechanical polishing technique.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making an opening for electrical contact, the method comprising:
    performing a first etch through a first dielectric layer to form a first via and a second dielectric layer;
    filling the first via with a BARC material to form a first BARC layer;
    performing a second etch on the first BARC layer to form a second BARC layer, the second etch having a first etch rate in a first peripheral region of the second BARC layer and a second etch rate in a first central region of the second BARC layer, the first peripheral region located around a sidewall of the first via, the first central region located around a center of the first via, the first etch rate being larger than the second etch rate, the first peripheral region located lower than the first central region, a first top surface of the second BARC layer having substantially a first convex shape, the second etch including a dry etch, the dry etch using a plurality of ions, the plurality of ions having a plurality of velocities respectively, the plurality of velocities having a plurality of angles with respect to a direction to direction vertical to a top surface of the first dielectric layer respectively, an average magnitude of the plurality of angles being smaller than 10 degrees;
    performing a third etch through a second dielectric layer to form a trench and a third BARC layer, the trench having a trench bottom surface, the trench bottom surface being substantially free from any spike around a side surface of the third BARC layer, a second top surface of the third BARC layer having substantially a second convex shape;
    removing the third BARC layer to form a second via,
    wherein the second etch uses a plasma having an electron temperature, the electron temperature being higher than 4 eV and lower than 10 eV.

2. The method of claim 1 wherein the plasma has a gas pressure, the gas pressure being lower than 40 mTorr.

3. A method for making an electrical contact, the method comprising:
    performing a first etch through a first protective layer and a first dielectric layer to form a first via, a second protective layer and a second dielectric layer, the first protective layer located on the first dielectric layer;
    filling the first via with a BARC material to form a first BARC layer;
    performing a second etch on the first BARC layer to form a second BARC layer, the second etch having a first etch rate in a first peripheral region of the second BARC layer and a second etch rate in a first central region of the second BARC layer, the first peripheral region located around a sidewall of the first via, the first central region located around a center of the first via, the first etch rate being larger than the second etch rate, the first peripheral region located lower than the first central region, the second etch including a dry etch, the dry etch using a plurality of ions, the plurality of ions having a plurality of velocities respectively, the plurality of velocities having a plurality of angles with respect to a direction to direction vertical to a top surface of the first dielectric layer respectively, an average magnitude of the plurality of angles being smaller than 10 degrees;
    performing a third etch through a second protective layer and a second dielectric layer to form a trench and a third BARC layer, the trench having a trench bottom surface, the trench bottom surface being substantially free from any spike around a side surface of the third BARC layer;
    removing the third BARC layer to form a second via, a cross-section of the second via being smaller than a cross-section of the trench;
    performing a fourth etch through a stop layer to form a third via, the dielectric layer located on the stop layer;
    filling the trench and the third via with a conductive material,
    wherein the second etch uses a plasma having an electron temperature, the electron temperature being higher than 4 eV and lower than 10 eV.

* * * * *

UNITED STATES PATENT AND TRADEMARK OFFICE
CERTIFICATE OF CORRECTION

PATENT NO. : 7,655,561 B2
APPLICATION NO. : 11/497552
DATED : February 2, 2010
INVENTOR(S) : Wu et al.

It is certified that error appears in the above-identified patent and that said Letters Patent is hereby corrected as shown below:

The drawing sheet, consisting of Figs. 1-18, should be deleted to be replaced with the drawing sheet, consisting of Figs. 1-18 as shown on the attached pages.

Signed and Sealed this

Eighth Day of June, 2010

David J. Kappos
*Director of the United States Patent and Trademark Office*

140

UNITED STATES PATENT AND TRADEMARK OFFICE
CERTIFICATE OF CORRECTION

PATENT NO. : 7,655,561 B2 Page 1 of 20
APPLICATION NO. : 11/497552
DATED : February 2, 2010
INVENTOR(S) : Wu et al.

It is certified that error appears in the above-identified patent and that said Letters Patent is hereby corrected as shown below:

Delete the title page and substitute therefore the attached title page consisting of corrected illustrative Fig. 18.

The drawing sheets, consisting of Figs. 1-18, should be deleted to be replaced with the drawing sheets, consisting of Figs. 1-18 as shown on the attached pages.

This certificate supersedes the Certificate of Correction issued June 8, 2010.

Signed and Sealed this

Twenty-ninth Day of June, 2010

David J. Kappos
*Director of the United States Patent and Trademark Office*

CERTIFICATE OF CORRECTION (continued)

(12) United States Patent
Wu et al.

(10) Patent No.: US 7,655,561 B2
(45) Date of Patent: *Feb. 2, 2010

(54) METHOD FOR MAKING AN OPENING FOR ELECTRICAL CONTACT BY ETCH BACK PROFILE CONTROL

(75) Inventors: Han Ming Wu, Shanghai (CN); Eric Kuang, Shanghai (CN); Wei Ji Song, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 117 days.

This patent is subject to a terminal disclaimer.

(21) Appl. No.: 11/497,552

(22) Filed: Jul. 31, 2006

(65) Prior Publication Data

US 2007/0087561 A1    Apr. 19, 2007

Related U.S. Application Data

(63) Continuation of application No. 10/773,565, filed on Feb. 6, 2004, now Pat. No. 7,084,054.

(30) Foreign Application Priority Data

Dec. 30, 2003    (CN) .................. 2003 1 0122966

(51) Int. Cl.
*H01L 21/4763* (2006.01)
(52) U.S. Cl. ............... 438/638; 438/706; 438/710; 257/E21.218
(58) Field of Classification Search .......... 438/622, 438/638, 706, 710; 257/E21.218
See application file for complete search history.

(56) References Cited

U.S. PATENT DOCUMENTS

| | | | |
|---|---|---|---|
| 7,084,054 B2 * | 8/2006 | Wu et al. | 438/622 |
| 2004/0077175 A1 * | 4/2004 | Hsieh et al. | 438/694 |
| 2004/0106297 A1 * | 6/2004 | Kanegae et al. | 438/725 |

* cited by examiner

*Primary Examiner*—Thanh Nguyen
(74) *Attorney, Agent, or Firm*—Townsend and Townsend and Crew LLP

(57) ABSTRACT

A method and apparatus for etchback profile control. The method includes performing a first etch through a first dielectric layer to form a first via and a second dielectric layer, filling the first via with a BARC material to form a first BARC layer, and performing a second etch on the first BARC layer to form a second BARC layer. The second etch has a first etch rate in a first peripheral region of the second BARC layer and a second etch rate in a first central region of the second BARC layer. The first peripheral region is located around a sidewall of the first via, and the first central region is located around a center of the first via. The first etch rate is larger than the second etch rate, and the first peripheral region is located higher than the first central region. A first top surface of the second BARC layer has substantially a first convex shape. Additionally, the method includes performing a third etch through a second dielectric layer to form a trench and a third BARC layer. The trench has a trench bottom surface, which is substantially free from any spike around a side surface of the third BARC layer. A second top surface of the third BARC layer has substantially a second convex shape. Moreover, the method includes removing the third BARC layer to form a second via.

3 Claims, 18 Drawing Sheets

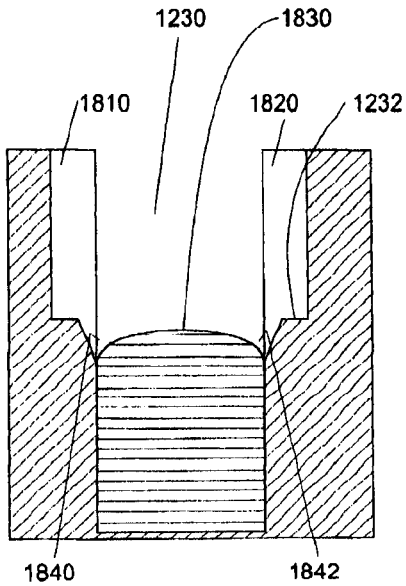

140